(12) United States Patent
Matsumoto et al.

(10) Patent No.: US 11,119,399 B2
(45) Date of Patent: *Sep. 14, 2021

(54) MASK BLANK, PHASE SHIFT MASK AND METHOD FOR MANUFACTURING SEMICONDUCTOR DEVICE

(71) Applicant: HOYA CORPORATION, Tokyo (JP)

(72) Inventors: Atsushi Matsumoto, Tokyo (JP); Hiroaki Shishido, Tokyo (JP); Takashi Uchida, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 46 days.

This patent is subject to a terminal disclaimer.

(21) Appl. No.: 15/760,265

(22) PCT Filed: Sep. 8, 2016

(86) PCT No.: PCT/JP2016/076402
§ 371 (c)(1),
(2) Date: Mar. 15, 2018

(87) PCT Pub. No.: WO2017/047490
PCT Pub. Date: Mar. 23, 2017

(65) Prior Publication Data
US 2018/0252995 A1    Sep. 6, 2018

(30) Foreign Application Priority Data

Sep. 18, 2015   (JP) .............................. JP2015-185779

(51) Int. Cl.
*G03F 1/32*     (2012.01)
*G03F 1/58*     (2012.01)
(Continued)

(52) U.S. Cl.
CPC .................. *G03F 1/32* (2013.01); *G03F 1/20* (2013.01); *G03F 1/38* (2013.01); *G03F 1/42* (2013.01);
(Continued)

(58) Field of Classification Search
CPC ..... G03F 1/32; G03F 1/48; G03F 1/58; G03F 1/80; G03F 1/38; G03F 1/20; G03F 1/42; H01L 21/0337
See application file for complete search history.

(56) References Cited

U.S. PATENT DOCUMENTS 9,933,698 B2 *   4/2018  Matsumoto ............... G03F 1/58
10,444,620 B2 * 10/2019  Matsumoto ............... G03F 1/58
(Continued)

FOREIGN PATENT DOCUMENTS

JP       63-085553      *  4/1988  ............... G03F 1/00
JP       2003-322947    * 11/2003  ............... G03F 1/08
(Continued)

OTHER PUBLICATIONS

Machine translation of jp-63-085553 (Apr. 1988).*
(Continued)

*Primary Examiner* — Martin J Angebranndt
(74) *Attorney, Agent, or Firm* — Kilpatrick Townsend & Stockton LLP

(57) ABSTRACT

According to the present invention, provided is a mask blank (10), in which: a light shielding film (4) has a single layer structure or a laminate structure of a plurality of layers; at least one layer of the light shielding film (4) is formed of a material which contains a transition metal and silicon and is free from nitrogen and oxygen, or a material which contains a transition metal, silicon, and nitrogen and satisfies a condition of the following expression (1); a phase shift film (2) has a surface layer and a layer other than the surface (Continued)

layer; and the layer other than the surface layer is formed of a material which contains a transition metal, silicon, nitrogen, and oxygen, has a content of oxygen of 3 atom % or more, and satisfies a condition of the following expression (A).

$$C_N \leq 9.0 \times 10^{-6} \times R_M^4 - 1.65 \times 10^{-4} \times R_M^3 - 7.718 \times 10^{-2} \times R_M^2 + 3.611 \times R_M - 21.084 \quad \text{Expression (1)}$$

$$0.04 \times A_S - 0.06 \times A_M > 1 \quad \text{Expression (A)}$$

42 Claims, 3 Drawing Sheets

(51) Int. Cl.
- *G03F 1/38* (2012.01)
- *G03F 1/48* (2012.01)
- *G03F 1/20* (2012.01)
- *G03F 1/42* (2012.01)
- *G03F 1/80* (2012.01)
- *H01L 21/033* (2006.01)

(52) U.S. Cl.
CPC ............ *G03F 1/48* (2013.01); *G03F 1/58* (2013.01); *G03F 1/80* (2013.01); *H01L 21/0337* (2013.01)

(56) References Cited

U.S. PATENT DOCUMENTS

| | | | |
|---|---|---|---|
| 2005/0260505 A1* | 11/2005 | Fukushima | C23C 14/0676 430/5 |
| 2006/0197228 A1* | 9/2006 | Daubenspeck | H01L 21/31144 257/773 |
| 2006/0257755 A1* | 11/2006 | Inazuki | G03F 1/32 430/5 |
| 2007/0212618 A1 | 9/2007 | Yoshikawa et al. | |
| 2007/0212619 A1* | 9/2007 | Yoshikawa | G03F 1/32 430/5 |
| 2007/0248897 A1* | 10/2007 | Yoshikawa | G03F 1/32 430/5 |
| 2009/0246647 A1* | 10/2009 | Hashimoto | G03F 1/46 430/5 |
| 2010/0092874 A1* | 4/2010 | Nozawa | G03F 1/32 430/5 |
| 2010/0119958 A1* | 5/2010 | Yoo | G03F 1/32 430/5 |
| 2010/0176087 A1* | 7/2010 | Igarashi | G03F 1/80 216/79 |
| 2011/0305978 A1 | 12/2011 | Iwashita et al. | |
| 2011/0318674 A1* | 12/2011 | Hashimoto | G03F 1/32 430/5 |
| 2012/0064438 A1* | 3/2012 | Yoshikawa | G03F 1/32 430/5 |
| 2012/0082924 A1* | 4/2012 | Kominato | G03F 1/58 430/5 |
| 2012/0115075 A1 | 5/2012 | Kominato et al. | |
| 2013/0130159 A1* | 5/2013 | Yoshikawa | G03F 1/26 430/5 |
| 2013/0309600 A1* | 11/2013 | Fukaya | G03F 1/32 430/5 |
| 2015/0072273 A1* | 3/2015 | Suzuki | G03F 1/32 430/5 |
| 2015/0104735 A1* | 4/2015 | Umezawa | G03F 1/26 430/5 |
| 2015/0338731 A1 | 11/2015 | Nozawa et al. | |

FOREIGN PATENT DOCUMENTS

| | | | |
|---|---|---|---|
| JP | 2007-241065 A | | 9/2007 |
| JP | 2010-217514 A | | 9/2010 |
| JP | 2012-058593 A | | 3/2012 |
| JP | 2012-113297 A | | 6/2012 |
| WO | 2009/123172 A1 | | 10/2009 |
| WO | 2014/112457 A1 | | 7/2014 |
| WO | 2015/141078 A1 | | 9/2015 |

OTHER PUBLICATIONS

Machine translation of JP 2003-332947 (2003).*
International Search Report of PCT/JP2016/076402 dated Nov. 22, 2016.

* cited by examiner

MASK BLANK, PHASE SHIFT MASK AND METHOD FOR MANUFACTURING SEMICONDUCTOR DEVICE

CROSS REFERENCE TO RELATED APPLICATIONS

This application is a National Stage of International Application No. PCT/JP2016/076402 filed Sep. 8, 2016, claiming priority based on Japanese Patent Application No. 2015-185779 filed Sep. 18, 2015.

TECHNICAL FIELD

This invention relates to a mask blank, a phase shift mask, and a method of manufacturing a semiconductor device.

BACKGROUND ART

In general, in a manufacturing process for a semiconductor device, a fine pattern is formed using a photolithography method. In forming the fine pattern, a large number of substrates, which are called transfer masks, are generally used. Each of the transfer masks is generally obtained by forming a fine pattern formed of a metal thin film or the like on a transparent glass substrate. The photolithography method is used also for the production of the transfer mask.

In forming a finer pattern of the semiconductor device, in addition to forming a finer mask pattern in a transfer mask, there is a need to use an exposure light source having a shorter wavelength in photolithography. In recent years, the wavelength of the exposure light source used in manufacturing the semiconductor device has become shorter from KrF excimer laser (wavelength: 248 nm) to ArF excimer laser (wavelength: 193 nm).

As types of the transfer mask, in addition to a related-art binary mask including a light shielding film pattern made of a chromium-based material on a transparent substrate, a halftone-type phase shift mask is known. The halftone-type phase shift mask includes a pattern of a phase shift film on a transparent substrate. The phase shift film has a function of transmitting light therethrough at an intensity substantially not contributing to exposure and a function of shifting the phase of light having been transmitted therethrough with respect to light having passed through air by the same distance, to thereby cause a so-called phase shift effect.

An outer peripheral region of a region on which a transfer pattern is formed of a transfer mask is generally required to ensure an optical density (OD) equal to or higher than a predetermined value so that a resist film on a semiconductor wafer is not affected by exposure light transmitted through the outer peripheral region when exposure transfer is performed on the resist film with an exposure apparatus. In general, the outer peripheral region of the transfer mask desirably has an OD of 3 or more, and is required to have an OD of at least about 2.7. However, the phase shift film of the halftone-type phase shift mask has a function of transmitting the exposure light at a predetermined transmittance, and hence it is difficult to ensure the optical density required for the outer peripheral region of the transfer mask with the phase shift film alone. Therefore, a light shielding film (film having a light shielding property) is laminated on a semi-transparent film having a predetermined phase shift amount and a predetermined transmittance of the exposure light, to thereby ensure a predetermined optical density with a laminate structure of the semi-transparent film and the light shielding film.

Meanwhile, in recent years, investigations have been made on forming a fine pattern in the light shielding film with increased accuracy using a transition metal silicide-based material for the light shielding film. A technology related thereto is disclosed in Patent Document 1.

However, as considered as a problem also in Patent Document 2, Patent Document 3, or the like, in recent years, it has been found that, when a MoSi-based (transition metal silicide-based) film is irradiated with ArF excimer laser exposure light (ArF exposure light) for a long period of time, a phenomenon in which the line width of a pattern of the MoSi-based film changes occurs. In order to address such problem, in Patent Document 2, there is a disclosure that a passive film is formed on a surface of a pattern formed of a MoSi-based film to improve light fastness to ArF exposure light (hereinafter sometimes referred to simply as "ArF light fastness"). In addition, in Patent Document 3, there is a disclosure of a technology involving configuring a transition metal silicon-based material film (sometimes referred to as "transition metal silicide-based material film") serving as a halftone phase shift film or the like to have a content of oxygen of 3 atom % or more, have a content of silicon and a content of a transition metal falling within a range which satisfies a predetermined relationship, and further, include a surface oxide layer formed on a surface layer of the transition metal silicon-based material film to improve ArF light fastness.

PRIOR ART DOCUMENTS

Patent Document

Patent Document 1: JP 2007-241065 A
Patent Document 2: JP 2010-217514 A
Patent Document 3: JP 2012-058593 A

SUMMARY OF THE INVENTION

Problem to be Solved by the Invention

In Patent Document 1, there is a description that transition metal silicide-based materials are used for a phase shift film and a light shielding film. However, in Patent Document 1, no consideration is given in terms of ArF light fastness of the materials to be applied to the phase shift film and the light shielding film. In Patent Document 2, the ArF light fastness is improved by forming the passive film on the surface of the pattern formed of the MoSi-based film. However, the method does not change the internal structure of the MoSi-based film. That is, the internal structure of the MoSi-based film can be said to have comparable ArF light fastness to those of the related art. Therefore, it is required to form the passive film not only on a surface layer on a top surface of the pattern formed of the MoSi-based film but also on a surface layer on a side wall thereof. In Patent Document 2, the passive film is formed through plasma treatment, UV irradiation treatment, or heating treatment after the pattern is formed in the MoSi-based film, but the pattern formed in the MoSi-based film has a large variation in sparseness and denseness in its plane, and also a distance between side walls of adjacent patterns often has a large variation. Therefore, there is a problem in that it is not easy to form passive films having the same thickness on all the side walls of the patterns.

In view of the above-mentioned problems, in Patent Document 3, means for solving the problem of ArF light fastness in the case of using the transition metal silicide-based material film is presented. In addition, experiments made by the applicant of this invention have ascertained that ArF light fastness tends to be obtained when the content of nitrogen is increased in the transition metal silicide-based material (see FIG. 2 to be described in an embodiment). That is, it is expected that, when transition metal silicide-based material films each having a content of nitrogen equal to or higher than a predetermined value are used as the phase shift film and the light shielding film of the halftone-type phase shift mask, accuracy in forming a fine pattern in each film can be increased while ArF light fastness is imparted.

In Patent Document 3, there is a disclosure of a mask blank having a structure in which a halftone phase shift film and a light shielding film are laminated on a transparent substrate in the stated order. In Patent Document 3, the halftone phase shift film is formed of a transition metal silicon-based material including a material containing a transition metal, silicon, oxygen, and nitrogen, and a composition supposed to exhibit high ArF light fastness in Patent Document 3 is adopted as the composition of the material. In Patent Document 3, there is a description that a film formed of a transition metal silicon-based material supposed to have high ArF light fastness is adopted as the light shielding film (light shielding film to be laminated on the halftone phase shift film). However, as another material to be used for the light shielding film to be laminated on the halftone phase shift film, only a material containing chromium (chromium-based material), which has hitherto been widely used, is described. That is, in Patent Document 3, there is only a disclosure that the light shielding film is formed of a material having high ArF light fastness.

It is the simplest approach to form the light shielding film to be arranged on the halftone phase shift film (hereinafter sometimes referred to simply as "phase shift film") using the chromium-based material because no particular consideration on ArF light fastness is required. However, from the viewpoint of the necessity of forming a fine pattern in the light shielding film, the chromium-based material cannot be said to be a preferred material. In the halftone-type phase shift mask (hereinafter sometimes referred to simply as "phase shift mask"), it is in the phase shift film that a transfer pattern including a fine pattern is formed. In the light shielding film, a relatively sparse pattern, such as a light shielding band, is formed. A mask blank to be used for producing the phase shift mask generally has a structure in which the phase shift film and the light shielding film are laminated in the stated order from a transparent substrate side.

In a process for producing the phase shift mask from the mask blank, the transfer pattern to be formed in the phase shift film is required to be formed in the light shielding film in advance through dry etching. This is because the transfer pattern is formed in the phase shift film through dry etching using, as an etching mask, the light shielding film in which the transfer pattern has been formed. The fine pattern is, albeit temporarily, formed in the light shielding film. Therefore, it is desired that a material capable of forming the fine pattern with high accuracy be applied to the light shielding film.

The light shielding film formed of the chromium-based material needs to be patterned through dry etching using a mixed gas of a chlorine-based gas and an oxygen gas. The dry etching using a mixed gas of a chlorine-based gas and an oxygen gas has a difficultly in increasing a tendency to anisotropic etching owing to the characteristics of the etching gas. Therefore, it is not easy to increase the form accuracy of a side wall of the pattern. It is also not easy to reduce a variation in in-plane (planar view) critical dimension (CD) accuracy. Moreover, the accuracy of the transfer pattern to be formed in the light shielding film affects the accuracy of the transfer pattern to be formed in the phase shift film through dry etching of the phase shift film.

In addition, a resist film formed of an organic material tends to be vulnerable to oxygen plasma. When a pattern is formed in the light shielding film formed of the chromium-based material through dry etching using the resist film as an etching mask, the resist film needs to have a large thickness. The light shielding film needs to have a thickness enough to ensure a predetermined optical density in view of the characteristics of the light shielding film, and hence also the resist film needs to have a corresponding large thickness. When the resist film has a large thickness, a fine pattern formed in the resist film has a high aspect ratio (a ratio of the height of the pattern to the width of the pattern), and the resist pattern is liable to collapse. It is disadvantageous in forming the fine pattern. In view of the foregoing, an increase in accuracy of the fine pattern to be formed in the light shielding film formed of the chromium-based material is limited in the present circumstances.

Meanwhile, when the light shielding film is formed of the transition metal silicide-based material, the light shielding film is patterned through dry etching using a fluorine-based gas. The dry etching using a fluorine-based gas offers a high tendency to anisotropic etching, and hence the form accuracy of the side wall of the pattern can be increased. As disclosed in Patent Document 1, an etching mask film formed of the chromium-based material is often used for an etching mask to be used for patterning the light shielding film, rather than the resist film formed of an organic material. In addition, an etching stopper film formed of the chromium-based material is often used between the phase shift film and the light shielding film because both the phase shift film and the light shielding film are formed of the transition metal silicide-based materials.

Further, although no consideration is given in Patent Document 1, when, in producing the phase shift mask from the mask blank having such laminate structure, a mark, such as an alignment mark, is configured by the laminate structure of the light shielding film and the phase shift film in an outer region of a transfer pattern formation region (an alignment mark pattern is formed in both the light shielding film and the phase shift film to form a mark recognized by contrast between a portion of the laminate structure of the light shielding film and the phase shift film and a portion in which a transparent substrate is exposed), the etching mask film needs to remain after the completion of dry etching for forming the transfer pattern in the etching stopper film as described below.

Therefore, the thicknesses and compositions of the etching mask film and the etching stopper film need to be designed so that an etching time required for dry etching for forming the pattern in the etching mask film is longer than an etching time required for dry etching for forming the pattern in the etching stopper film. With any design approach, the thickness of the resist film goes in an increasing direction as compared to a film design without consideration of the formation of the alignment mark.

Meanwhile, when the transfer pattern is formed in the light shielding film through dry etching using the etching mask film as a mask, the etching mask film formed of the chromium-based material, which has resistance to etching using a fluorine-based gas, is not entirely unetched. The surface of the etching mask film is continuously exposed to an etching gas increased in anisotropy (etching gas in a biased state) while the light shielding film is patterned, and hence the etching mask film is gradually etched by a physical action or the like. Therefore, the etching mask film needs to have a thickness in consideration of a reduction in its thickness through the dry etching using a fluorine-based gas for patterning the light shielding film and a reduction in its thickness through dry etching using a mixed gas of a chlorine-based gas and an oxygen gas for patterning the etching stopper film.

When the thickness of the etching mask film is increased, also the thickness of a resist film serving as a mask in patterning the etching mask film needs to be increased. Therefore, there is a demand for a reduction in thickness of the etching mask film. In order to reduce the thickness of the etching mask film, the thickness of the light shielding film is desired to be reduced. However, the light shielding film has such restriction that a predetermined optical density (OD) needs to be ensured. In order that the light shielding film is reduced in thickness while having a "light shielding" ability, which is the original function of the light shielding film, a material having a high optical density (OD) per unit film thickness is required. In the transition metal silicide-based material, in order to increase an optical density (OD) per unit film thickness, the contents of elements other than a transition metal and silicon need to be reduced. In particular, elements serving as factors for reducing an optical density are oxygen and nitrogen, and hence it is required that the contents of these elements be reduced. However, as described above, it is required that the content of nitrogen be equal to or higher than a predetermined value from the viewpoint of ArF light fastness. It has been considered that an inevitable trade-off relationship exists in that point.

In view of the foregoing, an object of this invention is to provide a phase shift mask in which the thickness of a light shielding film can be reduced and the problem of ArF light fastness can be solved even when a transition metal silicide-based material which is a material containing at least a transition metal and silicon (hereinafter sometimes referred to simply as "transition metal silicide-based material") is used from the viewpoint of forming a fine pattern in the light shielding film, a mask blank for producing the phase shift mask, and a method of manufacturing a semiconductor device.

Means to Solve the Problem

In order to achieve the above-mentioned object, this invention has the following configurations.

(Structure 1)

A mask blank, which has a structure in which a phase shift film, an etching stopper film, and a light shielding film are laminated on a transparent substrate in the stated order, wherein:

the light shielding film has a single layer structure or a laminate structure of a plurality of layers;

at least one layer of the light shielding film is formed of a material which contains a transition metal and silicon and is free from nitrogen and oxygen, or a material which contains a transition metal, silicon, and nitrogen and satisfies a condition of the following expression (1);

the phase shift film has a surface layer and a layer other than the surface layer; and the layer other than the surface layer is formed of a material which contains a transition metal, silicon, nitrogen, and oxygen, has a content of oxygen of 3 atom % or more, and satisfies a condition of the following expression (A):

$$C_N \leq 9.0 \times 10^{-6} \times R_M^4 - 1.65 \times 10^{-4} \times R_M^3 - 7.718 \times 10^{-2} \times R_M^2 + 3.611 \times R_M - 21.084 \quad \text{Expression (1)}$$

$$0.04 \times A_S - 0.06 \times A_M > 1 \quad \text{Expression (A)}$$

where $R_M$ represents a ratio [%] of a content [atom %] of the transition metal to a total content [atom %] of the transition metal and silicon in the at least one layer, $C_N$ [atom %] represents a content [atom %] of nitrogen in the at least one layer, $A_M$ represents a content [atom %] of the transition metal in the layer other than the surface layer, and $A_S$ represents a content [atom %] of silicon in the layer other than the surface layer.

(Structure 2)

A mask blank, which has a structure in which a phase shift film, an etching stopper film, and a light shielding film are laminated on a transparent substrate in the stated order, wherein:

the light shielding film has a single layer structure or a laminate structure of a plurality of layers;

at least one layer of the light shielding film is formed of a material which contains a transition metal and silicon and is free from nitrogen and oxygen, or a material which contains a transition metal, silicon, and nitrogen and satisfies a condition of the following expression (1);

the phase shift film has a surface layer and a layer other than the surface layer; and the layer other than the surface layer is formed of a material which contains a transition metal, silicon, nitrogen, and oxygen, has a content of oxygen of 3 atom % or more, and satisfies a condition of the following expression (B):

$$C_N \leq 9.0 \times 10^{-6} \times R_M^4 - 1.65 \times 10^{-4} \times R_M^3 - 7.718 \times 10^{-2} \times R_M^2 + 3.611 \times R_M - 21.084 \quad \text{Expression (1)}$$

$$0.04 \times A_S - 0.06 \times A_M - 0.03 \times A_N > -1 \quad \text{Expression (B)}$$

where $R_M$ represents a ratio [%] of a content [atom %] of the transition metal to a total content [atom %] of the transition metal and silicon in the at least one layer, $C_N$ [atom %] represents a content [atom %] of nitrogen in the at least one layer, $A_M$ represents a content [atom %] of the transition metal in the layer other than the surface layer, $A_S$ represents a content [atom %] of silicon in the layer other than the surface layer, and $A_N$ represents a content [atom %] of nitrogen in the layer other than the surface layer.

(Structure 3)

A mask blank, which has a structure in which a phase shift film, an etching stopper film, and a light shielding film are laminated on a transparent substrate in the stated order, wherein:

the light shielding film has a single layer structure or a laminate structure of a plurality of layers;

at least one layer of the light shielding film is formed of a material which contains a transition metal and silicon and is free from nitrogen and oxygen, or a material which contains a transition metal, silicon, and nitrogen and satisfies a condition of the following expression (1);

the phase shift film has a surface layer and a layer other than the surface layer; and the layer other than the surface layer is formed of a material which contains a transition metal, silicon, nitrogen, and oxygen, has a content of oxygen of 3 atom % or more, and satisfies a condition of the following expression (C):

$$C_N \leq 9.0 \times 10^{-6} \times R_M^4 - 1.65 \times 10^{-4} \times R_M^3 - 7.718 \times 10^{-2} \times R_M^2 + 3.611 \times R_M - 21.084 \quad \text{Expression (1)}$$

$$0.04 \times A_S - 0.06 \times A_M - 0.03 \times A_N + 0.02 \times A_O > 0 \quad \text{Expression (C)}$$

where $R_M$ represents a ratio [%] of a content [atom %] of the transition metal to a total content [atom %] of the transition metal and silicon in the at least one layer, $C_N$ [atom %] represents a content [atom %] of nitrogen in the at least one layer, $A_M$ represents a content [atom %] of the transition metal in the layer other than the surface layer, $A_S$ represents a content [atom %] of silicon in the layer other than the surface layer, $A_N$ represents a content [atom %] of nitrogen in the layer other than the surface layer, and $A_O$ represents a content [atom %] of oxygen in the layer other than the surface layer.

(Structure 4)

The mask blank according to any one of structures 1 to 3, wherein the surface layer of the phase shift film has a larger content of oxygen than the layer other than the surface layer.

(Structure 5)

The mask blank according to any one of structures 1 to 4, wherein the etching stopper film is formed of a material containing chromium.

(Structure 6)

The mask blank according to any one of structures 1 to 5, wherein a laminate structure of the phase shift film, the etching stopper film, and the light shielding film has an optical density for ArF excimer laser light of 2.7 or more.

(Structure 7)

The mask blank according to any one of structures 1 to 6, further comprising a hard mask film formed of a material containing chromium on the light shielding film.

(Structure 8)

A phase shift mask, which has a structure in which a phase shift film pattern, an etching stopper film pattern, and a light shielding film pattern are laminated on a transparent substrate in the stated order, wherein:

the light shielding film pattern has a single layer structure or a laminate structure of a plurality of layers;

at least one layer of the light shielding film pattern is formed of a material which contains a transition metal and silicon and is free from nitrogen and oxygen, or a material which contains a transition metal, silicon, and nitrogen and satisfies a condition of the following expression (1);

the phase shift film pattern has a surface layer and a layer other than the surface layer; and the layer other than the surface layer is formed of a material which contains a transition metal, silicon, nitrogen, and oxygen, has a content of oxygen of 3 atom % or more, and satisfies a condition of the following expression (A):

$$C_N \leq 9.0 \times 10^{-6} \times R_M^4 - 1.65 \times 10^{-4} \times R_M^3 - 7.718 \times 10^{-2} \times R_M^2 + 3.611 \times R_M - 21.084 \qquad \text{Expression (1)}$$

$$0.04 \times A_S - 0.06 \times A_M > 1 \qquad \text{Expression (A)}$$

where $R_M$ represents a ratio [%] of a content [atom %] of the transition metal to a total content [atom %] of the transition metal and silicon in the at least one layer, $C_N$ [atom %] represents a content [atom %] of nitrogen in the at least one layer, $A_M$ represents a content [atom %] of the transition metal in the layer other than the surface layer, and $A_S$ represents a content [atom %] of silicon in the layer other than the surface layer.

(Structure 9)

A phase shift mask, which has a structure in which a phase shift film pattern, an etching stopper film pattern, and a light shielding film pattern are laminated on a transparent substrate in the stated order, wherein:

the light shielding film pattern has a single layer structure or a laminate structure of a plurality of layers;

at least one layer of the light shielding film pattern is formed of a material which contains a transition metal and silicon and is free from nitrogen and oxygen, or a material which contains a transition metal, silicon, and nitrogen and satisfies a condition of the following expression (1);

the phase shift film pattern has a surface layer and a layer other than the surface layer; and the layer other than the surface layer is formed of a material which contains a transition metal, silicon, nitrogen, and oxygen, has a content of oxygen of 3 atom % or more, and satisfies a condition of the following expression (B):

$$C_N \leq 9.0 \times 10^{-6} \times R_M^4 - 1.65 \times 10^{-4} \times R_M^3 - 7.718 \times 10^{-2} \times R_M^2 + 3.611 \times R_M - 21.084 \qquad \text{Expression (1)}$$

$$0.04 \times A_S - 0.06 \times A_M - 0.03 \times A_N > -0.1 \qquad \text{Expression (B)}$$

where $R_M$ represents a ratio [%] of a content [atom %] of the transition metal to a total content [atom %] of the transition metal and silicon in the at least one layer, $C_N$ [atom %] represents a content [atom %] of nitrogen in the at least one layer, $A_M$ represents a content [atom %] of the transition metal in the layer other than the surface layer, $A_S$ represents a content [atom %] of silicon in the layer other than the surface layer, and $A_N$ represents a content [atom %] of nitrogen in the layer other than the surface layer.

(Structure 10)

A phase shift mask, which has a structure in which a phase shift film pattern, an etching stopper film pattern, and a light shielding film pattern are laminated on a transparent substrate in the stated order, wherein:

the light shielding film pattern has a single layer structure or a laminate structure of a plurality of layers;

at least one layer of the light shielding film pattern is formed of a material which contains a transition metal and silicon and is free from nitrogen and oxygen, or a material which contains a transition metal, silicon, and nitrogen and satisfies a condition of the following expression (1);

the phase shift film pattern has a surface layer and a layer other than the surface layer; and the layer other than the surface layer is formed of a material which contains a transition metal, silicon, nitrogen, and oxygen, has a content of oxygen of 3 atom % or more, and satisfies a condition of the following expression (C):

$$C_N \leq 9.0 \times 10^{-6} \times R_M^4 - 1.65 \times 10^{-4} \times R_M^3 - 7.718 \times 10^{-2} \times R_M^2 + 3.611 \times R_M - 21.084 \qquad \text{Expression (1)}$$

$$0.04 \times A_S - 0.06 \times A_M - 0.03 \times A_N 0.02 \times A_O > 0 \qquad \text{Expression (C)}$$

where $R_M$ represents a ratio [%] of a content [atom %] of the transition metal to a total content [atom %] of the transition metal and silicon in the at least one layer, $C_N$ [atom %] represents a content [atom %] of nitrogen in the at least one layer, $A_M$ represents a content [atom %] of the transition metal in the layer other than the surface layer, $A_S$ represents a content [atom %] of silicon in the layer other than the surface layer, $A_N$ represents a content [atom %] of nitrogen in the layer other than the surface layer, and $A_O$ represents a content [atom %] of oxygen in the layer other than the surface layer.

(Structure 11)

The phase shift mask according to any one of structures 8 to 10, wherein the surface layer of the phase shift film pattern has a larger content of oxygen than the layer other than the surface layer.

(Structure 12)

The phase shift mask according to any one of structures 8 to 11, wherein the etching stopper film pattern is formed of a material containing chromium.

(Structure 13)

The phase shift mask according to any one of structures 8 to 12, wherein a laminate structure of the phase shift film pattern, the etching stopper film pattern, and the light shielding film pattern has an optical density for ArF excimer laser light of 2.7 or more.

(Structure 14)

A method of manufacturing a semiconductor device, comprising a step of transferring a transfer pattern on a resist film formed on a transfer substrate by placing the phase shift mask of any one of structures 8 to 13 in an exposure apparatus comprising an exposure light source configured to emit ArF excimer laser light.

Effect of the Invention

According to the mask blank (the phase shift mask to be produced from the mask blank) of this invention, the thickness of the light shielding film can be reduced and the problem of ArF light fastness can be solved even when the transition metal silicide-based material is used for the light shielding film. In addition, according to the method of manufacturing a semiconductor device of this invention, in manufacturing a semiconductor device, the occurrence of a phenomenon in which the line width of a pattern changes is suppressed even when the phase shift mask is used for a long period of time (even when the phase shift mask is irradiated with ArF excimer laser exposure light for a long period of time).

MODES FOR EMBODYING THE INVENTION

Figure 1:
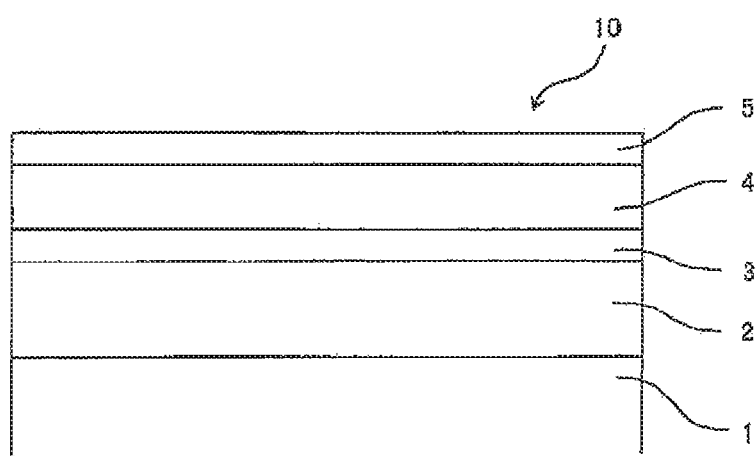
FIG. 1 is a sectional view for illustrating a layer configuration of a mask blank according to a first embodiment of this invention.

Embodiments of the present invention are specifically described below with reference to the drawings. The embodiments described below are embodiment modes of the present invention, and are not intended to limit the present invention to the scope of the embodiments.

In a phase shift mask having a structure in which a phase shift film pattern and a light shielding film pattern are laminated on a transparent substrate in the stated order from a transparent substrate side, when both a phase shift film and a light shielding film are to be formed using a transition metal silicide-based material, a design involving applying a transition metal silicide-based material having ArF light fastness to both the phase shift film and the light shielding film is generally adopted. However, as a result of extensive investigations, the inventors of this invention have found that no practical problem occurs when the transition metal silicide-based material applied to the light shielding film is a material considered to have not so high ArF light fastness.

In general, when the phase shift mask is placed on a mask stage of an exposure apparatus and exposure transfer is performed on a transfer target (for example, a resist film on a semiconductor wafer), exposure light enters from a rear surface side of the transparent substrate of the phase shift mask (a main surface on a side on which the phase shift film pattern is not formed). The exposure light having entered the transparent substrate enters the phase shift film (phase shift film pattern) from a main surface of the transparent substrate on the opposite side. Then, the light amount of the exposure light is reduced while the exposure light passes through the phase shift film. When the exposure light is emitted from a surface of the phase shift film, the exposure light has a light amount corresponding to a predetermined transmittance. Moreover, in a region in which the light shielding film exists on the phase shift film (in a region in which the light shielding film pattern exists), the exposure light having been reduced to the light amount corresponding to a predetermined transmittance (when an etching stopper film intermediates between the phase shift film and the light shielding film, the exposure light having further passed through the etching stopper film) enters the light shielding film.

The inventors of this invention have ascertained that a change in pattern line width caused when a thin-film pattern formed of a transition metal silicide-based material is irradiated with ArF exposure light is correlated with an ArF exposure light cumulative irradiation amount. As described above, the ArF exposure light irradiation amount of the light shielding film pattern of the phase shift mask per one exposure transfer on the transfer target is significantly smaller than that of the phase shift film pattern. That is, after exposure transfer is performed on the phase shift mask a predetermined times, the ArF exposure light cumulative irradiation amount of the light shielding film pattern is significantly smaller than that of the phase shift film pattern.

Therefore, when exposure transfer is performed on the transfer target using a phase shift mask having a structure in which a phase shift film pattern and a light shielding film pattern formed of a transition metal silicide-based material having low ArF light fastness are laminated on a transparent substrate, the number of times of use of the phase shift mask (the number of times of exposure transfer on the transfer target) until the line width of the light shielding film pattern changes into an unacceptable width is significantly increased as compared to the case in which exposure transfer is performed on the transfer target under the same conditions using a transfer mask having a structure in which a light shielding film pattern is arranged on a transparent substrate without intermediation of another film.

A change in pattern line width in association with ArF light fastness is not the only factor which influences the lifetime of the phase shift mask. For example, the phase shift mask needs to be cleaned with a chemical every predetermined number of times of its use. At the time of cleaning, the surfaces of the phase shift film pattern and the light shielding film pattern are dissolved with the chemical (a reduction in film thickness occurs), albeit gradually. The lifetime of the phase shift mask is ended at the time when the phase shift film or the light shielding film of the phase shift mask does not satisfy its optical characteristics owing to a reduction in film thickness through repetition of such cleaning. Other than the above, there are some factors which influence the lifetime (durable number of times) of the phase shift mask. When the amount of change in line width of the light shielding film caused by ArF exposure falls with an acceptable range until the end of the lifetime of the phase shift mask, which is determined by the plurality of factors to some degree, the phase shift mask is acceptable in terms of the performance of the light shielding film.

As a result of the extensive investigations described above, the inventors of this invention have arrived at the following: as long as the light shielding film is laminated on the transparent substrate through intermediation of the phase shift film configured to reduce the transmittance of ArF exposure light to a predetermined value, even when the transition metal silicide-based material for the light shielding film is selected without consideration on ArF light fastness, the amount of change in line width of the light shielding film caused by ArF exposure falls with an acceptable range at least until the end of the lifetime of the phase shift film, and the problem of ArF light fastness does not substantially occur. Moreover, the inventors have reached the conclusion that selection of a material for forming the light shielding film from the viewpoint of light shielding performance, which is a function originally required for the light shielding film, leads to provision of a mask blank capable of forming a fine pattern in the phase shift film.

As described above, in the case of using the transition metal silicide-based material in response to the requirement that a fine pattern be formed in the light shielding film, this invention is directed to providing, under existing circumstances in which an unsolvable trade-off relationship is considered to exist between the "requirement that a material having a high optical density per unit film thickness (specifically, a transition metal silicide-based material having small contents of oxygen and nitrogen) be required based on the requirements on light shielding performance and a reduction in film thickness for the light shielding film" and the "recent finding that high light fastness to ArF excimer laser exposure light is required (specifically, a transition metal silicide containing nitrogen in a predetermined amount or more needs to be used)," a mask blank in which the material having a high optical density per unit film thickness (specifically, the transition metal silicide having small contents of oxygen and nitrogen) is used for the light shielding film, a phase shift mask, and a method of manufacturing a semiconductor device by virtue of the above-mentioned finding first made by the applicant of this invention.

First Embodiment

FIG. 1 is a sectional view for illustrating a layer configuration of a mask blank 10 according to a first embodiment of this invention. The mask blank 10 according to this invention illustrated in FIG. 1 has a structure in which a phase shift film 2, an etching stopper film 3, a light shielding film 4, and a hard mask film 5 are laminated on a transparent substrate 1 in the stated order.

Now, description of each layer is given.

<<Transparent Substrate>>

The transparent substrate 1 is not particularly limited as long as the transparent substrate 1 has transparency to an ArF excimer laser. In this invention, a synthetic quartz substrate, or any of other various glass substrates (for example, soda lime glass or aluminosilicate glass) may be used. Of those various glass substrates, a synthetic quartz substrate has high transparency to ArF excimer laser or in a shorter wavelength region, and hence, is particularly suitable as a substrate for the mask blank of this invention to be used for forming a transfer pattern with high definition.

<<Phase Shift Film>>

The phase shift film 2 is configured to transmit light therethrough at an intensity substantially not contributing to exposure (for example, at an intensity of from 1% to 30%, preferably from 2% to 20% with respect to an exposure light wavelength) and generate a predetermined phase difference (for example, from 150° to 180°). Specifically, when the phase shift film 2 is patterned, a portion in which the phase shift film 2 remains and a portion in which the phase shift film 2 does not remain are formed. Thus, the phase of light having been transmitted through the phase shift film 2 (light having an intensity substantially not contributing to exposure) is in a substantially inverted relation to that of light having been transmitted through a portion without the phase shift film 2 (ArF excimer laser exposure light). With this, lights each diffracted into a region of the other light counteract each other through a diffraction phenomenon, and thus the intensity of light at their interface is made substantially zero and contrast at the interface, that is, resolution is improved. The thickness of the phase shift film 2 is preferably 90 nm or less.

When a negative tone development (NTD) process is applied as an exposure and development process for a resist film on a wafer, a bright field mask (a transfer mask having a high pattern opening rate) is used. In a bright field phase shift mask, a phase shift film having a relatively high transmittance provides a better balance between 0-order light and first-order light of light having been transmitted through a light transmitting portion, and improves a pattern resolution property on the resist film. This is because exposure light having been transmitted through the phase shift film interferes with the 0-order light to exhibit a higher reduction effect on a light intensity. When applied to the bright field phase shift mask, the phase shift film 2 preferably has a transmittance of 10% or more at an exposure wavelength. Also in this case, the phase shift film 2 has a transmittance of preferably 30% or less, more preferably 20% or less at the exposure wavelength.

The phase shift film 2 of the first embodiment includes a surface layer and a layer other than the surface layer. The layer other than the surface layer of the phase shift film 2 is formed of a material which contains a transition metal, silicon, nitrogen, and oxygen, has a content of oxygen of 3 atom % or more, and satisfies a condition of the following expression (A).

$$0.04 \times A_S - 0.06 \times A_M > 1 \qquad \text{Expression (A)}$$

In the expression, $A_M$ represents the content [atom %] of the transition metal in the layer other than the surface layer, and $A_S$ represents the content [atom %] of silicon in the layer other than the surface layer.

A change in line width of a pattern of a thin film (the phase shift film 2) formed of a transition metal silicide-based material caused through ArF exposure light irradiation is attributed to a phenomenon in which an alternation layer containing Si and O, and a slight amount of a transition metal is formed on the pattern on a surface layer side. The thin film formed of a transition metal silicide-based material having been formed into a film by a sputtering method is liable to have a structural gap. Oxygen or water in the air is liable to penetrate into the structural gap. When the phase shift film in such state is irradiated with ArF exposure light, ozone is generated from oxygen or water in the thin film. Silicon and the transition metal in the thin film are similarly irradiated with ArF exposure light to be excited, to thereby generate a silicon oxide and a transition metal oxide by being bonded to ozone. The transition metal oxide has a feature of easily diffusing in the thin film and precipitating in the surface layer. In addition, when the transition metal oxide precipitates in the surface layer of the thin film, a situation in which oxygen or water in the air is more liable to penetrate into the thin film occurs, with the result that oxidation of silicon and the transition metal in the thin film is further promoted. Therefore, concerning the relation between the content of silicon and the content of the transition metal in the thin film, when the content of the transition metal is small relative to the content of silicon as in a relationship expressed by the above-mentioned expression (A), the thin film can be increased in fastness to ArF exposure light irradiation.

The layer other than the surface layer of the phase shift film 2 is formed of the material which contains a transition metal, silicon, nitrogen, and oxygen. Examples of the transition metal in this case include any one or more metals of molybdenum (Mo), tantalum (Ta), tungsten (W), titanium (Ti), chromium (Cr), hafnium (Hf), nickel (Ni), vanadium (V), zirconium (Zr), ruthenium (Ru), rhodium (Rh), niobium (Nb), indium (In), tin (Sn), and palladium (Pd), and alloys of those metals. In addition to the above-mentioned elements, the material for the phase shift film 2 may contain an element such as nitrogen (N), oxygen (O), carbon (C), hydrogen (H), or boron (B). In addition, the material for the phase shift film 2 may contain a noble gas, such as helium (He), argon (Ar), krypton (Kr), or xenon (Xe).

Those materials each exhibit a high etching rate in dry etching using an etching gas including a fluorine-based gas, and easily impart various characteristics required for the phase shift film 2. In particular, those materials are each desired as a material for forming the phase shift film 2 which is required to strictly control the phase of exposure light transmitted therethrough.

The surface layer of the phase shift film 2 on a side brought into contact with the etching stopper film 3 preferably has a higher content of oxygen than the phase shift film 2 other than the surface layer. Through adoption of such surface layer, the surface layer of the phase shift film 2 can exhibit high resistance to a mixed gas of a chlorine-based gas and an oxygen gas serving as an etching gas when the etching stopper film 3 is removed by dry etching. As a method of forming such surface layer having a relatively high content of oxygen in the phase shift film 2, there are given, for example, a method involving subjecting the surface layer of the phase shift film 2 having been formed into a film to oxidation treatment, and a method involving forming a layer of a material having a high content of oxygen on a surface of the phase shift film 2 by a sputtering method. In addition, as the oxidation treatment, heat treatment in a gas containing oxygen (for example, in the air) or oxidation treatment on the surface layer through flash light irradiation with a flash lamp or the like may be adopted.

<<Etching Stopper Film>>

The etching stopper film 3 is formed of a material containing chromium, which has etching selectivity between the light shielding film 4 and the phase shift film 2 so that the proceeding of etching can be stopped between the light shielding film 4 and the phase shift film 2 during dry etching for forming a transfer pattern in the light shielding film 4. The material for the etching stopper film 3 may contain one or more elements selected from nitrogen (N), oxygen (O), carbon (C), hydrogen (H), and boron (B), in addition to the above-mentioned element, chromium (Cr). In addition, in order to increase an etching rate in dry etching using a chlorine-based gas and an oxygen gas and improve resistance to dry etching using a fluorine-based gas, the material for the etching stopper film 3 may contain one or more elements selected from indium (In) and tin (Sn). Further, the material for the etching stopper film 3 may contain a noble gas, such as helium (He), argon (Ar), krypton (Kr), or xenon (Xe). Specific examples of the material include CrN, CrON, CrOC, and CrOCN.

Meanwhile, the etching stopper film 3 may be formed of a material containing silicon and oxygen as long as sufficient etching selectivity to the light shielding film 4 described below is obtained in forming a fine pattern in the light shielding film 4 through dry etching using a fluorine-based gas. As a preferred material for forming the etching stopper film 3 in this case, there are given, for example, a material containing silicon and oxygen, and a material containing silicon, nitrogen, and oxygen.

The thickness of the etching stopper film 3 is preferably 3 nm or more, more preferably 4 nm or more. In addition, the thickness of the etching stopper film 3 is preferably 10 nm or less, more preferably 8 nm or less.

<<Light Shielding Film>>

As described above, in a phase shift mask having been produced from the mask blank, a fine pattern barely exists in the light shielding film 4. However, it is required that a fine pattern can be formed in the light shielding film 4 so that the fine pattern is accurately formed in the phase shift film 2. A transition metal silicide-based material is used for at least one layer of the light shielding film 4 so that the fine pattern can be formed, and the material to be used has a high optical density per unit film thickness so that a reduction in film thickness is achieved. Specifically, the at least one layer of the light shielding film 4 is formed of a material which contains a transition metal and silicon and is free from nitrogen and oxygen, or a material which contains a transition metal, silicon, and nitrogen and satisfies a condition of the following expression (1).

$$C_N \leq 9.0 \times 10^{-6} \times R_M^4 - 1.65 \times 10^{-4} \times R_M^3 - 7.718 \times 10^{-2} \times R_M^2 + 3.611 \times R_M - 21.084 \quad \text{Expression (1)}$$

In the expression (1), $R_M$ represents a ratio [%] of the content [atom %] of the transition metal to the total content [atom %] of the transition metal and silicon in the one layer, and $C_N$ [atom %] represents the content [atom %] of nitrogen in the one layer.

Examples of the transition metal include any one or more metals of molybdenum (Mo), tantalum (Ta), tungsten ON), titanium (Ti), chromium (Cr), hafnium (Hf), nickel (Ni), vanadium (V), zirconium (Zr), ruthenium (Ru), rhodium (Rh), niobium (Nb), indium (In), tin (Sn), and palladium (Pd), and alloys of those metals. Of those, molybdenum is preferred. The material for the light shielding film 4 may contain an element such as nitrogen (N), oxygen (O), carbon (C), hydrogen (H), or boron (B) in addition to the above-mentioned transition metal and silicon. However, the content of oxygen is required to be 5 atom % or less, preferably 3 atom % or less. It is more preferred that oxygen be not positively contained (a composition analysis result by RBS, XPS, or the like be equal to or lower than a detection lower limit). In addition, the material for the light shielding film 4 may contain a noble gas, such as helium (He), argon (Ar), krypton (Kr), or xenon (Xe).

The light shielding film 4 has a single layer structure or a laminate structure of two or more layers. The single layer structure can reduce the thickness of the light shielding film 4 the most. Therefore, in pursuit of a further reduction in thickness of the light shielding film 4, it is preferred that the light shielding film 4 have the single layer structure and the entirety of the light shielding film 4 be formed of the material which contains a transition metal and silicon and is free from nitrogen and oxygen, or the material which contains a transition metal, silicon, and nitrogen and satisfies a condition of the above-mentioned expression (1).

Meanwhile, the light shielding film 4 is often required to satisfy not only a condition of a predetermined optical density for ArF exposure light but also a condition of a surface reflectance of the ArF exposure light (for example, a surface reflectance of 40% or less, preferably 30% or less). In such case, the light shielding film 4 preferably has a structure in which an upper layer and a lower layer are laminated on each other in the stated order from a side farthest from the transparent substrate 1. Specifically, the lower layer is formed of a material having a high optical density, that is, the material which contains a transition metal and silicon and is free from nitrogen and oxygen, or the material which contains a transition metal, silicon, and nitrogen and satisfies a condition of the above-mentioned expression (1). Further, the upper layer is formed of a material having a relatively low optical density to have a function of reducing the surface reflectance. Alternatively, the light shielding film 4 may be a composition gradient film having an internal structure including a region formed of the above-mentioned material having a high optical density and a region formed of the above-mentioned material having a relatively low optical density.

The upper layer may be formed of a material other than the transition metal silicide-based material, but is preferably formed of a material containing a transition metal, silicon, and nitrogen. In this case, the total content of nitrogen and oxygen in the upper layer is desirably 30 atom % or more. In addition, from the viewpoint of reducing the entire thickness of the light shielding film, the total content of nitrogen and oxygen in the upper layer is preferably 60 atom % or less. Oxygen has a larger degree of reduction in extinction coefficient with respect to its content in the upper layer than nitrogen, and hence the transmittance of exposure light through the upper layer can be increased more, with the result that the surface reflectance can be reduced more. The content of oxygen in the upper layer is preferably 10 atom % or more, more preferably 15 atom % or more. Meanwhile, the content of nitrogen in the upper layer is desirably 10 atom % or more. The content of nitrogen is preferably 15 atom % or more, more preferably 20 atom % or more in order to reduce the surface reflectance while reducing the content of oxygen to some extent so that the thickness of the light shielding film 4 is reduced.

When the upper layer is formed of the transition metal silicide-based material, the content of a transition metal in the upper layer is preferably less than 10 atom %. When the content of a transition metal in the upper layer is 10 atom % or more, a phase shift mask produced from the mask blank has low resistance to mask cleaning (alkali cleaning with an ammonium hydrogen peroxide mixture or the like, or hot water cleaning), and there is a risk in that a change in optical characteristics (increase in surface reflectance) may occur owing to dissolution of the upper layer. This tendency is particularly remarkable when molybdenum is used as the transition metal in the upper layer.

Figure 2:
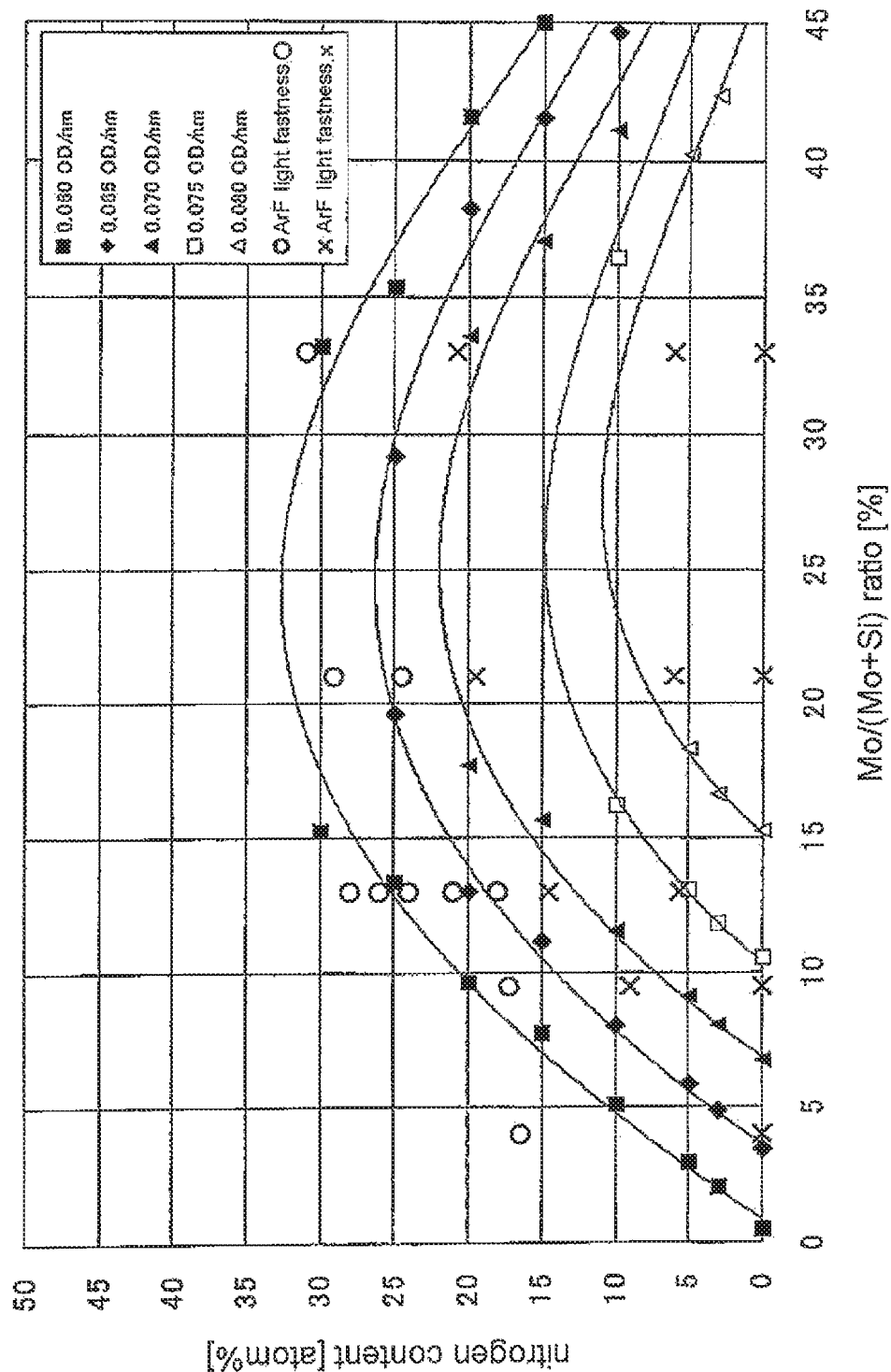
FIG. 2 is a graph for showing a relationship between a Mo/(Mo+Si) ratio and a content of nitrogen in a transition metal silicide-based material having a predetermined optical density per unit film thickness (in a range of from 0.060 [OD/nm] to 0.080 [OD/nm] with an increment of 0.005).

FIG. 2 is a graph obtained for light shielding films which each have a predetermined optical density (OD) per unit film thickness (1 nm) (in a range of from 0.060 [OD/nm] to 0.080 [OD/nm] with an increment of 0.005) and are each a thin film containing molybdenum and silicon and further nitrogen by plotting a ratio obtained by dividing the content [atom %] of molybdenum by the total content [atom %] of molybdenum and silicon (that is, a ratio of the content [atom %] of molybdenum represented by [%] when the total content [atom %] of molybdenum and silicon in the light shielding film is defined as 100, which is hereinafter referred to as "Mo/(Mo+Si) ratio") on the ordinate and the content of nitrogen on the abscissa, in which an approximate curve is drawn for corresponding light shielding films.

In addition, in FIG. 2, also examination results of the light fastness of the thin films having varied Mo/(Mo+Si) ratios and contents of nitrogen to ArF excimer laser exposure light are shown by plotting the symbol "○" or "×". The examination of ArF light fastness was performed by preparing a test mask in which a thin film formed of a transition metal silicide-based material had been formed on a transparent substrate and a line and space pattern having a pattern width (line width) of 200 [nm] was formed in the thin film. An ArF excimer laser, which was exposure light, was radiated from a transparent substrate side of the test mask so as to pass through the thin film. Intermittent irradiation, whose conditions were close to those of actual exposure with an exposure apparatus, was adopted for ArF excimer laser irradiation.

Specific irradiation conditions of the ArF excimer laser were as follows: an oscillating frequency of 500 [Hz]; an energy density per pulse of 10 [mJ/(cm$^2$·pulse)]; a number of continuously oscillating pulses of 10; a time required for oscillating the continuous 10 pulses of 20 [msec]; a pulse width of 5 [nsec]; and an interval time after the continuous oscillation of 500 [msec]. Under such irradiation conditions, intermittent irradiation was performed for 15 hours. The cumulative amount of exposure light applied to the thin film through the intermittent irradiation was 10 [kJ/cm$^2$]. In addition, the test mask was placed in the air at a relative humidity of 35% RH while being irradiated with the ArF excimer laser.

The pattern width (line width) of the thin film of the test mask was measured before and after the irradiation under the irradiation conditions described above, and an amount of change in line width before and after the irradiation with the ArF excimer laser was calculated. In addition, a thin film of a test mask in which an amount of change in line width is 10 [nm] or more is judged as not having ArF light fastness and the symbol "×" is plotted in FIG. 2 at a position corresponding to the Mo/(Mo+Si) ratio and the content of nitrogen of the thin film. Similarly, a thin film of a test mask in which an amount of change in line width is less than 10 [nm] is judged as having ArF light fastness and the symbol "○" is plotted in FIG. 2 at a position corresponding to the Mo/(Mo+Si) ratio and the content of nitrogen of the thin film.

As apparent from the plots of the symbols "○" and "×" in FIG. 2, it was found that, in the thin film formed of a molybdenum silicide-based material, a content of nitrogen at a certain level or higher was required for exhibiting ArF light fastness. In addition, it was also found that, in terms of the presence or absence of ArF light fastness, a lower limit of the content of nitrogen changed depending on the Mo/(Mo+Si) ratio. Further, it is also found that, while the tendency of optical densities per unit film thickness and the examination results of the ArF light fastness shown in FIG. 2 are obtained for the thin film formed of a molybdenum silicide-based material, a silicide-based material (MSi) of a transition metal M other than molybdenum also has similar tendency. That is, almost the same results are obtained even when a M/(M+Si) ratio is plotted on the ordinate in FIG. 2.

In the graph of FIG. 2, an approximate expression for an approximate curve based on plots each having an optical density per unit film thickness of 0.070 [OD/nm] (plots represented by the symbol "▲" in FIG. 2) is the above-mentioned expression (1). When a material within a range below and including the approximate curve represented by the expression (1) in FIG. 2 (a side having a lower content of nitrogen) is used, the thickness of the light shielding film 4 can be reduced. As apparent from the plots of the symbols "○" and "×" for the ArF light fastness in FIG. 2, the range below and including the approximate curve represented by the expression (1) is a range having a difficulty with ArF light fastness. As described above, in consideration of the provision of "a phase shift mask (a mask blank for producing the phase shift mask) having ArF light fastness," selection of the material within the range has not conventionally been conceived.

When the thickness of the light shielding film 4 is to be further reduced, it is preferred that a ratio $R_M$ [%] of the content [atom %] of a transition metal to the total content [atom %] of the transition metal and silicon of the light shielding film 4, and the content [atom %] of nitrogen $C_N$ of the light shielding film 4 fall within a range below and including an approximate curve based on plots each having an optical density of 0.075 [OD/nm] in FIG. 2 (plots represented by the symbol "□" in FIG. 2). The approximate curve in this case is defied by the following expression (2).

$$C_N \leq 9.84 \times 10^{-4} \times R_M^3 - 1.232 \times 10^{-1} \times R_M^2 + 4.393 \times R_M - 33.413 \quad \text{Expression (2)}$$

Further, it is preferred that a ratio $R_M$ [%] of the content [atom %] of a transition metal to the total content [atom %] of the transition metal and silicon of the light shielding film 4, and the content [atom %] of nitrogen $C_N$ of the light shielding film 4 fall within a range below and including an approximate curve based on plots each having an optical density of 0.080 [OD/nm] in FIG. 2 (plots represented by the symbol "Δ" in FIG. 2). The approximate curve in this case is defied by the following expression (3).

$$C_N \leq 1.355 \times 10^{-3} \times R_M^3 - 1.668 \times 10^{-1} \times R_M^2 + 6.097 \times R_M - 58.784 \quad \text{Expression (3)}$$

Each of the approximate expressions of the expressions (1) to (3) is calculated based on the corresponding plots in FIG. 2, and hence somewhat varies depending on a calculation method. However, a shift in a boundary line obtained by the "M/(M+Si) ratio" and the "content of nitrogen" on which each of the predetermined optical densities is satisfied caused by the variation in approximate expression has a small influence on a variation in optical density, and such influence falls within an acceptable range.

The entire thickness of the light shielding film 4 is preferably 50 nm or less, more preferably 45 nm or less. In addition, the entire thickness of the light shielding film 4 is preferably 20 nm or more, more preferably 25 nm or more. In addition, when the light shielding film 4 is configured to have a structure in which the upper layer and the lower layer are laminated in the stated order from a side farthest from the transparent substrate 1, the thickness of the upper layer is preferably 3 nm or more, more preferably 4 nm or more. In addition, the thickness of the upper layer is preferably 10 nm or less, more preferably 8 nm or less. In order to impart, to the upper layer, a function of reducing a reflectance of the light shielding film 4 with respect to ArF exposure light, and suppress a variation in reflectance in its plane, the thickness of the upper layer is required to be 3 nm or more. Meanwhile, the case in which the thickness of the upper layer is too large is not preferred because the entire thickness of the light shielding film 4 is inevitably increased.

<<Hard Mask Film>>

A material containing chromium is used for the hard mask film 5 so that etching selectivity between the light shielding film 4 and the hard mask film 5 can be ensured in dry etching at the time of patterning for forming the transfer pattern in the light shielding film 4. The material for the hard mask film 5 may contain one or more elements selected from nitrogen (N), oxygen (O), carbon (C), hydrogen (H), and boron (B) in addition to the above-mentioned element, chromium (Cr). In addition; in order to increase an etching rate in dry etching using a chlorine-based gas and an oxygen gas and improve resistance to dry etching using a fluorine-based gas, the material for the hard mask film 5 may contain one or more elements selected from indium (In) and tin (Sn). Further, the material for the hard mask film 5 may contain a noble gas, such as helium (He), argon (Ar), krypton (Kr), or xenon (Xe). Specific examples of the material include CrN, CrON, CrOC, and CrOCN.

The thickness of the hard mask film 5 is preferably 3 nm or more, more preferably 5 nm or more. When the thickness of the hard mask film 5 is less than 3 nm, there is a risk in that a reduction in thickness of the hard mask film 5 proceeds in a pattern edge direction before the completion of dry etching on the light shielding film 4 using a hard mask film pattern as a mask, and a pattern transferred onto the light shielding film 4 is significantly reduced in CD accuracy with respect to a design pattern. In addition; the thickness of the hard mask film 5 is preferably 15 nm or less, more preferably 12 nm or less. When the thickness of the hard mask film 5 is more than 15 nm, the thickness of a resist film required for transferring the design pattern on the hard mask film 5 is increased, and it becomes difficult to accurately transfer a fine pattern onto the hard mask film 5.

Both the etching stopper film 3 and the hard mask film 5 are formed of materials containing chromium, and are films to be patterned through dry etching using a mixed gas of oxygen and chlorine. As the material for the etching stopper film 3, materials each containing chromium similar to the above-mentioned materials for the hard mask film 5 are given. As illustrated in a process for producing a phase shift mask from the mask blank of the first embodiment described below, it is required that the hard mask film 5 on the light shielding film 4 remain even after the completion of dry etching for forming the transfer pattern (phase shift pattern) on the etching stopper film 3. Therefore, when the thickness of the etching stopper film 3 is defined as Ds, the etching rate of the etching stopper film 3 in a mixed gas of oxygen and chlorine is defined as Vs, the thickness of the hard mask film 5 is defined as Dh, and the etching rate of the hard mask film 5 in the mixed gas of oxygen and chlorine is defined as Vh, it is desired that a relationship of (Dh/Vh)>(Ds/Vs) be satisfied.

In addition, it is preferred that the hard mask film 5 remain at a thickness of 2 nm or more after the etching stopper film 3 is patterned through the dry etching using a mixed gas of oxygen and chlorine. This aims to ensure that the hard mask film 5 remain irrespective of etching conditions until the completion of the dry etching on the phase shift film 2 using a fluorine-based gas. From this viewpoint, it is preferred that also a relationship of Dh−2·Ds·(Vh/Vs)≥2 [nm] be satisfied at the same time. In this case, the patterning of the etching stopper film 3 includes, after just etching on the etching stopper film 3, performing over etching on the etching stopper film 3 for the same time as a time required for the just etching, to thereby improve a vertical property of a side wall shape of a pattern in the etching stopper film 3.

In order that the etching stopper film 3 and the hard mask film 5 satisfy the above-mentioned conditions, the most adjustable method includes forming the etching stopper film 3 and the hard mask film 5 using materials having almost the same composition so that the hard mask film 5 has a larger thickness than the etching stopper film 3 (preferably by 2 nm or more). As another method, there is given a method involving selecting, as the material for forming the etching stopper film 3, a material having a higher etching rate in the mixed gas of oxygen and chlorine than the material for forming the hard mask film 5. As a method of increasing the etching rate of a film formed of a chromium-based material in the mixed gas of oxygen and chlorine, a method involving increasing the content of oxygen or nitrogen in the material is effective. However, this adjustment method also has an aspect of reducing resistance to the etching using a fluorine-based gas.

When the content of the indium (In) or tin (Sn) is increased in the film formed of a chromium-based material, the etching rate of the film formed of a chromium-based material in the mixed gas of oxygen and chlorine can be increased, while the increase is not as remarkable as in the case of increasing the content of oxygen or nitrogen. Besides, there is another advantage in that a reduction in resistance to the etching using a fluorine-based gas caused by increasing the content of indium (In) or tin (Sn) in the film formed of a chromium-based material is small.

The layers of the mask blank 10 of the first embodiment have been described. In the mask blank of this invention, a laminate structure of the phase shift film 2, the etching stopper film 3, and the light shielding film 4 is required to have an optical density (OD) for ArF excimer laser light (wavelength: 193 nm) of 2.7 or more, preferably 3.0 or more. In consideration of the functions required for the films of the laminate structure (laminate film), it is desired that the light shielding film 4 have a higher optical density. According to this embodiment, as described above, the material having a high optical density per unit film thickness is adopted, and hence the light shielding film 4 can be formed to have a small thickness. When seen as a phase shift mask, as apparent also from the foregoing, the etching stopper film 3 may be functionally considered as part of the light shielding film 4 (it can be said that the light shielding film has a laminate structure of a plurality of layers).

Also in the case in which the phase shift film 2 of this embodiment has an optical characteristic of a transmittance (10% or more) suitable for a bright field phase shift mask, the laminate structure of the phase shift film 2, the etching stopper film 3, and the light shielding film 4 is still required to have an optical density for exposure light of 2.7 or more, preferably 3.0 or more. In this case, the light shielding film 4 is required to have a higher optical density, and hence a larger effect is obtained by applying the configuration of the light shielding film 4 of this embodiment.

Figure 3:
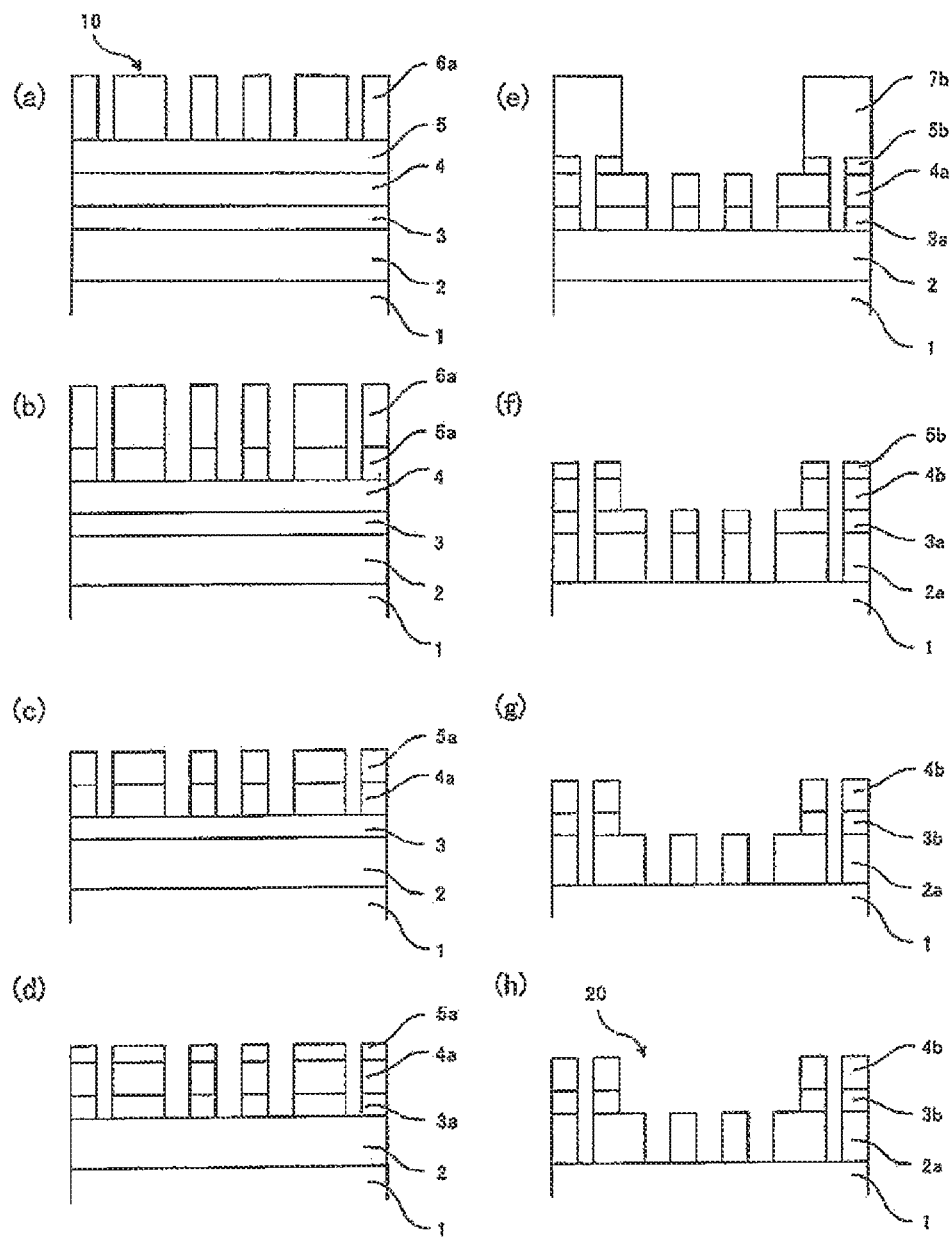
FIG. 3 includes sectional views for illustrating a production process for a phase shift mask according to a first embodiment of this invention.

Next, a method of producing a phase shift mask using the mask blank 10 of this embodiment described above is described. FIG. 3 includes sectional views for illustrating a production process for a phase shift mask 20 according to a first embodiment of this invention. A method of producing the phase shift mask 20 according to the first embodiment is described according to the production process illustrated in FIG. 3. The configuration of the mask blank 10 to be used herein (see FIG. 3(a)) is as described above.

First, a first resist film formed of an organic material is formed on the hard mask film 5 of the mask blank 10 (FIG. 1). Next, a desired pattern (transfer pattern) to be formed in the phase shift film 2 is drawn in a first resist film 6 formed on the mask blank 10 with an electron beam. Through development treatment after the drawing with an electron beam, a first resist pattern 6a having the desired transfer pattern is formed (see FIG. 3(a)). Next, dry etching using a mixed gas of a chlorine-based gas and an oxygen gas is performed using the first resist pattern 6a having the transfer pattern as a mask to form a hard mask film pattern 5a having the transfer pattern (see FIG. 3(b)). Examples of the chlorine-based gas used in the mixed gas of a chlorine-based gas and an oxygen gas include $Cl_2$, $SiCl_4$, $CHCl_3$, $CH_2Cl_2$, $CCl_4$, and $BCl_3$. After the hard mask film pattern 5a is formed, the remaining first resist pattern 6a is removed.

Next, dry etching using a fluorine-based gas is performed using the hard mask film pattern 5a as a mask to form a light shielding film pattern 4a having the transfer pattern (see FIG. 3(c)). Examples of the fluorine-based gas to be used herein include $SF_6$, $CHF_3$, $CF_4$, $C_2F_6$, and $C_4F_8$.

Next, dry etching using a mixed gas of a chlorine-based gas and an oxygen gas is performed using the light shielding film pattern 4a as a mask to form an etching stopper film pattern 3a having the transfer pattern (see FIG. 3(d)). Also the hard mask film pattern 5a is etched through the etching for forming the etching stopper film pattern 3a, and hence the hard mask film 5 needs to have such configuration that the hard mask film pattern 5a does not disappear at this stage.

Next, a second resist film is formed on the hard mask film pattern 5a, and a desired light shielding pattern including a light shielding band to be formed in the light shielding film 4 is drawn in the second resist film with an electron beam. Through development treatment after the drawing with an electron beam, a second resist pattern 7b having the light shielding pattern is formed. Next, dry etching using a mixed gas of a chlorine-based gas and an oxygen gas is performed using the second resist pattern 7b having the light shielding pattern as a mask to form a hard mask film pattern 5b having the light shielding pattern (see FIG. 3(e)).

Next, after the remaining second resist pattern 7b is removed, dry etching using a fluorine-based gas is performed using the hard mask film pattern 5b having the light shielding pattern and the etching stopper film pattern 3a having the transfer pattern as masks to form a light shielding film pattern 4b having the light shielding pattern and a phase shift film pattern 2a having the transfer pattern in one step (see FIG. 3(f)).

Then, dry etching using a mixed gas of a chlorine-based gas and an oxygen gas is performed using the light shielding film pattern 4b as a mask to form an etching stopper film pattern 3b having the light shielding pattern and remove the hard mask film pattern 5b (treatment in one step (see FIG. 3(g))). After that, predetermined cleaning is performed. Thus, the phase shift mask 20 is obtained (see FIG. 3(h)).

In the phase shift mask 20, an alignment mark to be used for alignment of the phase shift mask 20 at the time of placing the phase shift mask 20 in an exposure apparatus is formed in an outer peripheral region of a region on which the transfer pattern is formed (see FIG. 3(h)). The alignment mark is desired to have high contrast, and an alignment mark pattern is required to be able to be formed also in the phase shift film 2 (that is, the alignment mark is formed by a portion of the laminate structure of the phase shift film 2, the etching stopper film 3, and the light shielding film 4 and a portion in which the surface of the substrate 1 is exposed). In order to form such alignment mark, it is required that the hard mask film 5 remain after the completion of the dry etching using a mixed gas of a chlorine-based gas and an oxygen gas for forming a fine pattern in the etching stopper film 3 (see FIG. 3(d)). However, as the thickness of the hard mask film 5 is increased more, also the thickness of the resist pattern 6a needs to be increased more, Therefore, it is unacceptable to unlimitedly increase the thickness of the hard mask film 5, When the light shielding film 4 having a predetermined optical density can be formed to have a smaller thickness, a reduction in thickness of the hard mask film 5 caused through the dry etching on the light shielding film 4 using a fluorine-based gas can be reduced. Also from such viewpoint, it is a very important factor to reduce the thickness of the light shielding film 4. According to this invention, a mask blank suitable for such requirement can be provided.

The remaining first resist pattern 6a is removed after the hard mask film pattern 5a is formed in the production process illustrated in FIG. 3, but the first resist pattern 6a may be left as it is. In this case, the first resist pattern 6a is left until the processes for forming the light shielding film pattern 4a and the etching stopper film pattern 3a. The first resist pattern 6a only needs to remain on the hard mask film pattern 5a at least halfway through the dry etching for forming the etching stopper film pattern 3a. When such process is performed, the hard mask film pattern 5a is protected with the first resist pattern 6a at least halfway through the dry etching for forming the etching stopper film pattern 3a, and is prevented from being etched with the etching gas of a chlorine-based gas and an oxygen gas while being protected. Therefore, in this case, the hard mask film 5 and the etching stopper film 3 do not need to satisfy the relationship of (Dh/Vh)>(Ds/Vs).

<Method of Manufacturing Semiconductor Device>

A semiconductor device in which various patterns or the like are formed on a semiconductor substrate can be manufactured by forming a pattern based on the transfer pattern of the phase shift mask 20 on the semiconductor substrate by a lithography technology using the phase shift mask 20 of this embodiment, and performing other various steps.

An exposure apparatus includes an exposure light source for ArF excimer laser exposure light, a projection optical system, a mask stage on which a transfer mask (phase shift mask) is to be mounted, a stage on which a semiconductor substrate is to be mounted, and the like. In the exposure apparatus in which the phase shift mask 20 of this embodiment is mounted and a semiconductor substrate with a resist film is mounted on the stage, exposure light obtained from the exposure light source for ArF excimer laser exposure light is allowed to enter the phase shift mask 20 appropriately through the optical system, and transfer is performed on the semiconductor substrate with a resist film with light having been transmitted through the phase shift mask 20 (transfer pattern), through the projection optical system (the transfer pattern is transferred onto the resist film formed on a transfer substrate). Then, when etching or the like is performed using the resist pattern as a mask, for example, a predetermined wiring pattern can be formed on the semiconductor substrate. The semiconductor device is manufactured by such steps, and other required steps. Consideration is given on the ArF light fastness of the phase shift mask 20 of this embodiment, and hence an amount of change in pattern line width is suppressed within an acceptable range even when the phase shift mask 20 is used for a long period of time (even when the phase shift mask 20 is irradiated with ArF excimer laser exposure light for a long period of time).

Second Embodiment

Next, a mask blank 10 according to a second embodiment of this invention is described. The mask blank 10 of the second embodiment has the same configurations as the mask blank 10 of the first embodiment except that the configuration of the phase shift film 2 differs from that of the mask blank 10 of the first embodiment. The same configurations as in the first embodiment are denoted by the same signs as in the first embodiment, and descriptions thereof are omitted or simplified herein. Accordingly, a description is given mainly of the phase shift film 2 of the mask blank 10 of the second embodiment below.

<<Phase Shift Film>>

The phase shift film 2 of the second embodiment includes a surface layer and a layer other than the surface layer. The layer other than the surface layer of the phase shift film 2 is formed of a material which contains a transition metal, silicon, nitrogen, and oxygen, has a content of oxygen of 3 atom % or more, and satisfies a condition of the following expression (B).

$$0.04 \times A_S - 0.06 \times A_M - 0.03 \times A_N > -0.1 \qquad \text{Expression (B)}$$

In the expression, $A_M$ represents the content [atom %] of the transition metal in the layer other than the surface layer, $A_S$ represents the content [atom %] of silicon in the layer other than the surface layer, and $A_N$ represents the content [atom %] of nitrogen in the layer other than the surface layer.

A thin film (the phase shift film 2) containing a transition metal (M), silicon (Si), nitrogen (N), and oxygen (O) may be in various bonding states in its inside. Of such bonding states, a M-N bonding state is a relatively unstable bonding state. When a transition metal M subjected to a M-N bonding is irradiated with ArF exposure light, the transition metal M is excited to cleave its bonding to nitrogen, to thereby form a transition metal oxide by being bonded to ozone. As described above, the transition metal oxide promotes the formation of the alternation layer in the surface layer of the thin film. From this viewpoint, it is preferred that the content of silicon, the content of a transition metal, and the content of nitrogen in the phase shift film 2 satisfy a relationship as expressed by the expression (B). When the phase shift film 2 satisfies the relationship expressed by the above-mentioned expression (B), the thin film can be increased in fastness to ArF exposure light irradiation.

Other matters involved in the phase shift film 2 are the same as in the phase shift film 2 in the first embodiment. In addition, a process for producing a phase shift mask 20 from the mask blank 10 of this embodiment and a method of manufacturing a semiconductor device using the phase shift mask 20 are the same as in the first embodiment, and hence descriptions thereof are omitted.

Third Embodiment

Next, a mask blank 10 according to a third embodiment of this invention is described. The mask blank 10 of the third embodiment has the same configurations as the mask blank 10 of the first embodiment except that the configuration of the phase shift film 2 differs from that of the mask blank 10 of the first embodiment. The same configurations as in the first embodiment are denoted by the same signs as in the first embodiment, and descriptions thereof are omitted or simplified herein. A description is given mainly of the phase shift film 2 of the mask blank of the third embodiment below.

<<Phase Shift Film>>

The phase shift film 2 of the third embodiment includes a surface layer and a layer other than the surface layer. The layer other than the surface layer of the phase shift film 2 is formed of a material which contains a transition metal, silicon, nitrogen, and oxygen, has a content of oxygen of 3 atom % or more, and satisfies a condition of the following expression (C).

$$0.04 \times A_S - 0.06 \times A_M - 0.03 \times A_N + 0.02 \times A_O > 0 \qquad \text{Expression (C)}$$

In the expression, $A_M$ represents the content [atom %] of the transition metal in the layer other than the surface layer, $A_S$ represents the content [atom %] of silicon in the layer other than the surface layer, $A_N$ represents the content [atom %] of nitrogen in the layer other than the surface layer, and $A_O$ represents the content [atom %] of oxygen in the layer other than the surface layer.

A thin film (the phase shift film 2) containing a transition metal (M), silicon (Si), nitrogen (N), and oxygen (O) may be in various bonding states in its inside. Of such bonding states, a M-N bonding state is a relatively unstable bonding state. When a transition metal M subjected to a M-N bonding is irradiated with ArF exposure light, the transition metal M is excited to cleave its bonding to nitrogen, to thereby form a transition metal oxide by being bonded to ozone. As described above, the transition metal oxide promotes the formation of the alternation layer in the surface layer of the thin film. In addition, when the transition metal oxide promotes the formation of the alternation layer in the surface layer of the thin film, the content of oxygen in the thin film also affects light fastness to ArF exposure light. From this viewpoint, it is preferred that the content of silicon, the content of a transition metal, the content of nitrogen, and the content of oxygen in the phase shift film 2 satisfy a relationship as expressed by the expression (C). When the phase shift film 2 satisfies the relationship expressed by the above-mentioned expression (C), the thin film can be increased in fastness to ArF exposure light irradiation.

Other matters involved in the phase shift film 2 are the same as in the phase shift film 2 in the first embodiment. In addition, a process for producing a phase shift mask 20 from the mask blank 10 of this embodiment and a method of manufacturing a semiconductor device using the phase shift mask 20 are the same as in the first embodiment, and hence descriptions thereof are omitted.

EXAMPLES

The embodiments of this invention are more specifically described below by means of Examples.

Example 1

[Manufacture of Mask Blank]

A transparent substrate 1 formed of synthetic quartz glass having dimensions of a main surface of about 152 mm by about 152 mm and a thickness of about 6.35 mm was prepared. The transparent substrate 1 was a substrate having its end surfaces and the main surface polished to a predetermined surface roughness, and then being subjected to predetermined cleaning treatment and drying treatment.

Next, the transparent substrate 1 was placed in a sheet-type DC sputtering apparatus, and a phase shift film 2 formed of molybdenum, silicon, oxygen, and nitrogen (MoSiON film, Mo: 8.1 atom %, Si: 41.2 atom %, O: 16.8 atom %, N: 33.9 atom %) was formed on the transparent substrate 1 so as to have a thickness of 73 nm by reactive sputtering (DC sputtering) using a mixed target of molybdenum (Mo) and silicon (Si) in an atmosphere of a mixed gas of argon (Ar), oxygen ($O_2$), nitrogen ($N_2$), and helium (He).

The composition of the phase shift film 2 was plugged in the left side of the above-mentioned expression (A), and calculation of the expression resulted in a value of 1.16, which was higher than 1. With this, the phase shift film 2 was able to be confirmed to satisfy a condition of the expression (A). Similarly, the composition of the phase shift film 2 was plugged in the left side of the expression (B), and calculation of the expression resulted in a value of 0.15, which was higher than −0.1. With this, the phase shift film 2 was able to be confirmed to also satisfy a condition of the expression (B). Similarly, the composition of the phase shift film 2 was plugged in the left side of the expression (C), and calculation of the expression resulted in a value of 0.48, which was higher than 0. With this, the phase shift film 2 was able to be confirmed to also satisfy a condition of the expression (C).

Next, the transparent substrate 1 on which the phase shift film 2 was formed was subjected to annealing treatment through flash lamp irradiation. Specifically, the MoSiON film was irradiated with flash lamp light having an energy density of 10 J/cm² in a chamber having an atmosphere of a mixed gas of oxygen ($O_2$) and nitrogen ($N_2$) (gas flow rate ratio $O_2:N_2=30:70$). In this case, an irradiation time of the flash lamp light and a heating temperature of the substrate were set to 5 msec and 300° C., respectively. The phase shift film 2 after the flash lamp irradiation was analyzed by a scanning transmission electron microscope (STEM) and energy dispersive X-ray spectrometry (EDX). As a result, it was confirmed that, on the phase shift film 2, an oxide layer having a thickness of about 2 nm from the surface of the phase shift film 2 was formed. The phase shift film 2 was measured for a transmittance and a phase difference at the wavelength (193 nm) of ArF excimer laser light with a phase shift amount measurement apparatus. The result was that the transmittance was 6.1%, and the phase difference was 176.8°.

Next, the transparent substrate 1 was placed in the sheet-type DC sputtering apparatus, and an etching stopper film 3 formed of chromium, oxygen, carbon, and nitrogen (CrOCN film, Cr: 48.9 atom %, O: 26.4 atom %, C: 10.6 atom %, N: 14.1 atom %) was formed in contact with the surface of the phase shift film 2 so as to have a thickness of 5 nm by reactive sputtering (DC sputtering) using a chromium (Cr) target in an atmosphere of a mixed gas of argon (Ar), nitrogen ($N_2$), carbon dioxide ($CO_2$), and helium (He). The result of the composition of the CrOCN film was obtained by auger electron spectroscopy (AES). The same applies to other films below.

Next, the transparent substrate 1 was placed in the sheet-type DC sputtering apparatus, and a lower layer of a light shielding film 4 formed of molybdenum and silicon (MoSi film, Mo: 20.3 atom %, Si: 79.7 atom %) was formed in contact with the surface of the etching stopper film 3 so as to have a thickness of 15 nm by reactive sputtering (DC sputtering) using a mixed target of molybdenum (Mo) and silicon (Si) (Mo:Si=21 atom %:79 atom %) in an atmosphere of a mixed gas of argon (Ar) and helium (He). Next, the transparent substrate 1 was placed in the sheet-type DC sputtering apparatus, and an upper layer of the light shielding film 4 formed of molybdenum, silicon, oxygen, and nitrogen (MoSiON film, Mo: 2.6 atom %, Si: 57.1 atom %, O: 15.9 atom %, N: 24.4 atom %) was formed in contact with the surface of the lower layer of the light shielding film 4 so as to have a thickness of 10 nm by reactive sputtering (DC sputtering) using a mixed target of molybdenum (Mo) and silicon (Si) (Mo:Si=4 atom %:96 atom %) in an atmosphere of a mixed gas of argon (Ar), oxygen ($O_2$), nitrogen ($N_2$), and helium (He). The total thickness of the light shielding film 4 was set to 25 nm.

A laminate film of the phase shift film 2, the etching stopper film 3, and the light shielding film 4 laminated on the transparent substrate 1 was measured for an optical density (OD) for light having a wavelength of 193 nm with a spectroscopic ellipsometer (manufactured by J. A. Woollam Co., Inc., M-2000D). As a result, it was able to be confirmed that the optical density was 3.0 or more.

Next, the transparent substrate 1 was placed in the sheet-type DC sputtering apparatus, and a hard mask film 5 formed of chromium, oxygen, carbon, and nitrogen (CrOCN film, Cr: 48.9 atom %, O: 26.4 atom %, O: 10.6 atom %, N: 14.1 atom %) was formed in contact with the surface of the light shielding film 4 so as to have a thickness of 15 nm by reactive sputtering (DC sputtering) using a chromium (Cr) target in an atmosphere of a mixed gas of argon (Ar), nitrogen ($N_2$), carbon dioxide ($CO_2$), and helium (He). Further, predetermined cleaning treatment was performed, Thus, a mask blank 10 of Example 1 was obtained.

[Production of Phase Shift Mask]

Next, a phase shift mask 20 of Example 1 was produced by the following procedures using the mask blank 10 of Example 1. First, a first resist film formed of a chemically amplified resist for electron beam lithography was formed in contact with the surface of the hard mask film 5 so as to have a thickness of 80 nm by a spin coating method. Next, a first pattern was drawn in the first resist film with an electron beam. Then, predetermined development treatment and cleaning treatment were performed to form a first resist film (first resist pattern) 6a having the first pattern (see FIG. 3(a)). The first pattern was a pattern in which: a transfer pattern of the DRAM hp 32-nm generation (a fine pattern including Sub Resolution Assist Features (SRAF) having a line width of 40 nm) to be formed in the phase shift film 2 was arranged in a transfer pattern formation region (inner region measuring 132 mm×104 mm); and an alignment mark pattern was arranged in a region which was an outer region of the transfer pattern formation region and was a region on which a light shielding band was to be formed (a region in which the light shielding film 4 was left at the completion of the phase shift mask).

Next, dry etching using the first resist pattern 6a as a mask and a mixed gas of chlorine and oxygen was performed on the hard mask film 5 to form a hard mask film (hard mask film pattern) 5a having the first pattern (see FIG. 3(b)). After that, the first resist pattern 6a was removed.

Next, dry etching using the hard mask film pattern 5a as a mask and a fluorine-based gas ($CF_4$) was performed on the light shielding film 4 to form a light shielding film (light shielding film pattern) 4a having the first pattern (see FIG. 3(c)).

Next, dry etching using the light shielding film pattern 4a as a mask and a mixed gas of chlorine and oxygen was performed to form an etching stopper film (etching stopper film pattern) 3a having the first pattern (see FIG. 3(d)). An etching time of the dry etching was twice the just etching time of the etching stopper film 3 (100% over etching). In this case, also the hard mask film pattern 5a was etched with the mixed gas of chlorine and oxygen from its surface, but was able to remain at a thickness of about 5 nm.

Next, a second resist film formed of a chemically amplified resist for electron beam lithography was formed in contact with the surface of the hard mask film pattern 5a so as to have a thickness of 80 nm by a spin coating method. Next, a second pattern was drawn in the second resist film with an electron beam. Then, predetermined development treatment and cleaning treatment were performed to form a second resist film (second resist pattern) 7b having the second pattern. The second pattern was a pattern in which a pattern of a light shielding band was arranged in the outer region of the transfer pattern formation region.

Next, dry etching using the second resist pattern 7b as a mask and a mixed gas of chlorine and oxygen was performed to form a hard mask film (hard mask film pattern) 5b having the second pattern and the alignment mark pattern (see FIG. 3(e)). After that, the second resist pattern 7b was removed.

Next, dry etching using the etching stopper film pattern 3a as a mask and an etching gas containing a fluorine-based gas ($SF_6$+He) was performed to form a phase shift film (phase shift film pattern) 2a having the first pattern. In addition, also a light shielding film (light shielding film pattern) 4b having the second pattern and the alignment mark pattern was formed using the hard mask film pattern 5b as a mask at the same time (see FIG. 3(f)).

Next, dry etching using the light shielding film pattern 4b as a mask and a mixed gas of chlorine and oxygen was performed to form an etching stopper film (etching stopper film pattern) 3b having the second pattern and the alignment mark pattern. In addition, the hard mask film pattern 5b was entirely removed through the dry etching at the same time. After that, predetermined cleaning was performed. Thus, the phase shift mask 20 was obtained (see FIG. 3(g)).

[Examination Experiment on ArF Light Fastness]

The phase shift mask 20 of Example 1 thus produced was subjected to an examination experiment on ArF light fastness. The phase shift mask 20 of Example 1 was irradiated with ArF excimer laser from a transparent substrate 1 side at two positions on the phase shift mask 20, specifically, a position in the transfer pattern formation region at which only the phase shift film pattern 2a existed and a position in a region in which the light shielding band was formed at which the phase shift film pattern 2a, the etching stopper film pattern 3b, and the light shielding film pattern 4b were laminated. Intermittent irradiation, whose conditions were close to those of actual exposure with an exposure apparatus, was adopted for ArF excimer laser irradiation.

Specific irradiation conditions of the ArF excimer laser were as follows: an oscillating frequency of 500 [Hz]; an energy density per pulse of 10 [$mJ/(cm^2 \cdot pulse)$]; a number of continuously oscillating pulses of 10; a time required for oscillating the continuous 10 pulses of 20 [msec]; a pulse width of 5 [nsec]; and an interval time after the continuous oscillation of 500 [msec]. Under such irradiation conditions, intermittent irradiation was performed for 15 hours. The cumulative amount of exposure light applied to a thin film through the intermittent irradiation was 10 [$kJ/cm^2$]. In addition, the phase shift mask 20 was placed in the air at a relative humidity of 35% RH while being irradiated with the ArF excimer laser.

The pattern width of the phase shift film pattern 2a and the pattern width of the light shielding film pattern 4b were measured at the irradiation positions before and after the ArF excimer laser irradiation, and an amount of change in each line width before and after the ArF excimer laser irradiation was calculated. As a result, the amount of change in line width of the phase shift film pattern 2a was 2.8 nm, and the phase shift film pattern 2a was able to be confirmed to have sufficiently high ArF light fastness. In addition, also the amount of change in line width of the light shielding film pattern 4b was 3.9 nm, and the light shielding film pattern 4b was able to be confirmed to have sufficiently high ArF light fastness.

[Evaluation of Pattern Transfer Performance]

For the phase shift mask 20 of Example 1 after the examination experiment on ArF light fastness, simulation of a transfer image formed through exposure transfer on a resist film on a semiconductor device using exposure light having a wavelength of 193 nm was performed with aerial image metrology system (AIMS) 193 (manufactured by Carl Zeiss). Examination of the exposure transfer image formed through the simulation revealed that short-circuit and disconnection did not occur in the pattern and design specifications were sufficiently satisfied. From the result, it can be said that, even when the phase shift mask 20 of Example 1 is placed on a mask stage of an exposure apparatus to perform exposure transfer on a resist film on a semiconductor device, a circuit pattern to be finally formed on the semiconductor device can be formed with high accuracy. In addition, the contrast of the alignment mark was not mismatched among the phase shift film pattern 2a, the etching stopper film pattern 3b, and the light shielding film pattern 4b, and also high contrast to detection light of an alignment mark detector was able to be obtained.

Example 2

[Production of Mask Blank]

A transparent substrate 1 was prepared by the same procedures as in Example 1. Next, the transparent substrate 1 was placed in a sheet-type DC sputtering apparatus, and a phase shift film 2 formed of molybdenum, silicon, oxygen, and nitrogen (MoSiON film, Mo: 3.2 atom %, Si: 49.1 atom %, O: 8.9 atom %, N: 38.8 atom %) was formed on the transparent substrate 1 so as to have a thickness of 71 nm by reactive sputtering (DC sputtering) using a mixed target of molybdenum (Mo) and silicon (Si) in an atmosphere of a mixed gas of argon (Ar), oxygen ($O_2$), nitrogen ($N_2$), and helium (He).

The composition of the phase shift film 2 was plugged in the left side of the above-mentioned expression (A), and calculation of the expression resulted in a value of 1.77, which was higher than 1. With this, the phase shift film 2 was able to be confirmed to satisfy a condition of the expression (A). Similarly, the composition of the phase shift film 2 was plugged in the left side of the expression (B), and calculation of the expression resulted in a value of 0.61, which was higher than −0.1. With this, the phase shift film 2 was able to be confirmed to also satisfy a condition of the expression (B). Similarly, the composition of the phase shift film 2 was plugged in the left side of the expression (C), and calculation of the expression resulted in a value of 0.79, which was higher than 0. With this, the phase shift film 2 was able to be confirmed to also satisfy a condition of the expression (C).

Next, the transparent substrate 1 on which the phase shift film 2 was formed was subjected to annealing treatment through flash lamp irradiation. Specifically, the MoSiON film was irradiated with flash lamp light having an energy density of 10 $J/cm^2$ in a chamber having an atmosphere of a mixed gas of oxygen ($O_2$) and nitrogen ($N_2$) (gas flow rate ratio $O_2:N_2$=30:70). In this case, an irradiation time of the flash lamp light and a heating temperature of the substrate were set to 5 msec and 300° C., respectively. The phase shift film 2 after the flash lamp irradiation was analyzed by STEM and EDX. As a result, it was confirmed that, on the phase shift film 2, an oxide layer having a thickness of about 2 nm from the surface of the phase shift film 2 was formed. The phase shift film 2 was measured for a transmittance and a phase difference at the wavelength (193 nm) of ArF excimer laser light with a phase shift amount measurement apparatus. The result was that the transmittance was 6.2%, and the phase difference was 177.3°.

Next, an etching stopper film 3, a light shielding film 4, and a hard mask film 5 were formed in contact with the surface of the phase shift film 2 in the stated order by the same procedures as in Example 1. Further, predetermined cleaning treatment was performed. Thus, a mask blank 10 of Example 2 was obtained. At a stage prior to the formation of the hard mask film 5, a laminate film of the phase shift film 2, the etching stopper film 3, and the light shielding film 4 laminated on the transparent substrate 1 was measured for an optical density (OD) for light having a wavelength of 193 nm with a spectroscopic ellipsometer (manufactured by J. A. Woollam Co., Inc., M-2000D). As a result, it was able to be confirmed that the optical density was 3.0 or more.

[Production of Phase Shift Mask]

A phase shift mask 20 of Example 2 was produced using the mask blank 10 of Example 2 by the same procedures as in Example 1.

[Examination Experiment on ArF Light Fastness]

The phase shift mask 20 of Example 2 thus produced was subjected to an examination experiment on ArF light fastness by the same procedures as in Example 1. As a result, the amount of change in line width of the phase shift film pattern 2a before and after the ArF excimer laser irradiation was 2.7 nm, and the phase shift film pattern 2a was able to be confirmed to have sufficiently high ArF light fastness. In addition, also the amount of change in line width of the light shielding film pattern 4b before and after the ArF excimer laser irradiation was 3.9 nm, and the light shielding film pattern 4b was able to be confirmed to have sufficiently high ArF light fastness.

[Evaluation of Pattern Transfer Performance]

For the phase shift mask 20 of Example 2 after the examination experiment on ArF light fastness, simulation of a transfer image formed through exposure transfer on a resist film on a semiconductor device using exposure light having a wavelength of 193 nm was performed with AIMS 193 (manufactured by Carl Zeiss). Examination of the exposure transfer image formed through the simulation revealed that short-circuit and disconnection did not occur in the pattern and design specifications were sufficiently satisfied. From the result, it can be said that, even when the phase shift mask 20 of Example 2 is placed on a mask stage of an exposure apparatus to perform exposure transfer on a resist film on a semiconductor device, a circuit pattern to be finally formed on the semiconductor device can be formed with high accuracy. In addition, the contrast of the alignment mark was not mismatched among the phase shift film pattern 2a, the etching stopper film pattern 3b, and the light shielding film pattern 4b, and also high contrast to detection light of an alignment mark detector was able to be obtained.

Example 3

[Production of Mask Blank]

A transparent substrate 1 was prepared by the same procedures as in Example 1. Next, the transparent substrate 1 was placed in a sheet-type DC sputtering apparatus, and a phase shift film 2 formed of molybdenum, silicon, oxygen, and nitrogen (MoSiON film, Mo: 6.8 atom %, Si: 45.9 atom %, O: 3.6 atom %, N: 43.7 atom %) was formed on the transparent substrate 1 so as to have a thickness of 70 nm by reactive sputtering (DC sputtering) using a mixed target of molybdenum (Mo) and silicon (Si) in an atmosphere of a mixed gas of argon (Ar), oxygen ($O_2$), nitrogen ($N_2$), and helium (He).

The composition of the phase shift film 2 was plugged in the left side of the above-mentioned expression (A), and calculation of the expression resulted in a value of 1.43, which was higher than 1. With this, the phase shift film 2 was able to be confirmed to satisfy a condition of the expression (A). Similarly, the composition of the phase shift film 2 was plugged in the left side of the expression (B), and calculation of the expression resulted in a value of 0.12, which was higher than −0.1. With this, the phase shift film 2 was able to be confirmed to also satisfy a condition of the expression (B). Similarly, the composition of the phase shift film 2 was plugged in the left side of the expression (C), and calculation of the expression resulted in a value of 0.19, which was higher than 0. With this, the phase shift film 2 was able to be confirmed to also satisfy a condition of the expression (C).

Next, the transparent substrate 1 on which the phase shift film 2 was formed was subjected to annealing treatment through flash lamp irradiation. Specifically, the MoSiON film was irradiated with flash lamp light having an energy density of 10 J/cm$^2$ in a chamber having an atmosphere of a mixed gas of oxygen (O$_2$) and nitrogen (N$_2$) (gas flow rate ratio O$_2$:N$_2$=30:70). In this case, an irradiation time of the flash lamp light and a heating temperature of the substrate were set to 5 msec and 300° C., respectively. The phase shift film 2 after the flash lamp irradiation was analyzed by STEM and EDX. As a result, it was confirmed that, on the phase shift film 2, an oxide layer having a thickness of about 2 nm from the surface of the phase shift film 2 was formed. The phase shift film 2 was measured for a transmittance and a phase difference at the wavelength (193 nm) of ArF excimer laser light with a phase shift amount measurement apparatus. The result was that the transmittance was 6.1%, and the phase difference was 177.7°.

Next, an etching stopper film 3, a light shielding film 4, and a hard mask film 5 were formed in contact with the surface of the phase shift film 2 in the stated order by the same procedures as in Example 1, Further, predetermined cleaning treatment was performed, Thus, a mask blank 10 of Example 3 was obtained. At a stage prior to the formation of the hard mask film 5, a laminate film of the phase shift film 2, the etching stopper film 3, and the light shielding film 4 laminated on the transparent substrate 1 was measured for an optical density (OD) for light having a wavelength of 193 nm with a spectroscopic ellipsometer (manufactured by J. A. Woollam Co., Inc., M-2000D), As a result, it was able to be confirmed that the optical density was 3.0 or more.

[Production of Phase Shift Mask]

Next, a phase shift mask 20 of Example 3 was produced using the mask blank 10 of Example 3 by the same procedures as in Example 1.

[Examination Experiment on ArF Light Fastness]

The phase shift mask 20 of Example 3 thus produced was subjected to an examination experiment on ArF light fastness by the same procedures as in Example 1. As a result, the amount of change in line width of the phase shift film pattern 2a before and after the ArF excimer laser irradiation was 2.4 nm, and the phase shift film pattern 2a was able to be confirmed to have sufficiently high ArF light fastness. In addition, also the amount of change in line width of the light shielding film pattern 4b before and after the ArF excimer laser irradiation was 3.9 nm, and the light shielding film pattern 4b was able to be confirmed to have sufficiently high ArF light fastness.

[Evaluation of Pattern Transfer Performance]

For the phase shift mask 20 of Example 3 after the examination experiment on ArF light fastness, simulation of a transfer image formed through exposure transfer on a resist film on a semiconductor device using exposure light having a wavelength of 193 nm was performed with AIMS 193 (manufactured by Carl Zeiss). Examination of the exposure transfer image formed through the simulation revealed that short-circuit and disconnection did not occur in the pattern and design specifications were sufficiently satisfied. From the result, it can be said that, even when the phase shift mask 20 of Example 3 is placed on a mask stage of an exposure apparatus to perform exposure transfer on a resist film on a semiconductor device, a circuit pattern to be finally formed on the semiconductor device can be formed with high accuracy. In addition, the contrast of the alignment mark was not mismatched among the phase shift film pattern 2a, the etching stopper film pattern 3b, and the light shielding film pattern 4b, and also high contrast to detection light of an alignment mark detector was able to be obtained.

REFERENCE SIGNS LIST

1 . . . transparent substrate
2 . . . phase shift film
2a . . . phase shift film pattern
3 . . . etching stopper film
3a, 3b . . . etching stopper film pattern
4 . . . light shielding film
4a, 4b . . . light shielding film pattern
5 . . . hard mask film
5a, 5b . . . hard mask film pattern
6a . . . first resist pattern
7b . . . second resist pattern
10 . . . mask blank
20 . . . phase shift mask

The invention claimed is:

1. A mask blank comprising:
a transparent substrate;
a phase shift film on the transparent substrate;
an etching stopper film on the phase shift film; and
a light shielding film on the etching stopper film,
wherein the etching stopper film contains silicon and oxygen, and
wherein the light shielding film has a lower layer and an upper layer formed on the lower layer, and
wherein the lower layer contains a transition metal, silicon, and nitrogen and satisfies the following expression (1):

$$C_N \leq (9.0 \times 10^{-6} \times R_M^4) - (1.65 \times 10^{-4} \times R_M^3) - (7.718 \times 10^{-2} \times R_M^2) + (3.611 \times R_M) - 21.084 \quad \text{Expression (1)}$$

where $R_M$ represents a ratio [%] of a content [atom %] of the transition metal to a total content [atom %] of the transition metal and silicon in the at least one layer and where $C_N$ [atom %] represents a content [atom %] of nitrogen in the at least one layer, and
wherein the upper layer contains a transition metal, silicon, oxygen and nitrogen, and
wherein a total content of nitrogen and oxygen in the upper layer is 30 atom % or more, and
wherein a content of transition metal in the upper layer is less than 10 atom %, and
wherein the phase shift film has a surface layer and a layer other than the surface layer having a different composition than the surface layer, and
wherein the layer other than the surface layer contains a transition metal, silicon, nitrogen, and oxygen; has a content of oxygen of 3 atom % or more; and satisfies the following expression (A):

$$(0.04 \times A_S) - (0.06 \times A_M) > 1 \quad \text{Expression (A)}$$

where $A_M$ represents a content [atom %] of the transition metal in the layer other than the surface layer, and where $A_S$ represents a content [atom %] of silicon in the layer other than the surface layer.

2. The mask blank according to claim 1, wherein a content of oxygen in the surface layer of the phase shift film is larger than a content of oxygen in the layer other than the surface layer.

3. The mask blank according to claim 1, wherein a multilayer structure comprises the phase shift film, the etching stopper film, and the light shielding film and has an optical density for ArF excimer laser light of at least 2.7.

4. The mask blank according to claim 1, further comprising a hard mask film on the light shielding film, the hard mask film comprising chromium.

5. The mask blank according to claim 1, wherein the etching stopper film essentially consists of silicon and oxygen.

6. The mask blank according to claim 1, wherein a content of oxygen in the lower layer is 5 atom % or less.

7. The mask blank according to claim 1, wherein a content of oxygen in the upper layer is 10 atom % or more.

8. A mask blank comprising:
a transparent substrate;
a phase shift film on the transparent substrate;
an etching stopper film on the phase shift film; and
a light shielding film on the etching stopper film,
wherein the etching stopper film contains silicon and oxygen, and
wherein the light shielding film has a lower layer and an upper layer formed on the lower layer, and
wherein the lower layer contains a transition metal, silicon, and nitrogen and satisfies the following expression (1):

$$C_N \leq (9.0 \times 10^{-6} \times R_M^4) - (1.65 \times 10^{-4} \times R_M^3) - (7.718 \times 10^{-2} \times R_M^2) + (3.611 \times R_M) - 21.084 \quad \text{Expression (1)}$$

where $R_M$ represents a ratio [%] of a content [atom %] of the transition metal to a total content [atom %] of the transition metal and silicon in the at least one layer and where $C_N$ [atom %] represents a content [atom %] of nitrogen in the at least one layer, and
wherein the upper layer contains a transition metal, silicon, oxygen and nitrogen, and
wherein a total content of nitrogen and oxygen in the upper layer is 30 atom % or more, and
wherein a content of transition metal in the upper layer is less than 10 atom %, and
wherein the phase shift film has a surface layer and a layer other than the surface layer having a different composition than the surface layer, and
wherein the layer other than the surface layer contains a transition metal, silicon, nitrogen, and oxygen; has a content of oxygen of 3 atom % or more; and satisfies the following expression (B):

$$(0.04 \times A_S) - (0.06 \times A_M) - (0.03 \times A_N) > 1 \quad \text{Expression (B)}$$

where $A_M$ represents a content [atom %] of the transition metal in the layer other than the surface layer, $A_S$ represents a content [atom %] of silicon in the layer other than the surface layer, and $A_N$ represents a content [atom %] of nitrogen in the layer other than the surface layer.

9. The mask blank according to claim 8, wherein a content of oxygen in the surface layer of the phase shift film is larger than a content of oxygen in the layer other than the surface layer.

10. The mask blank according to claim 8, wherein a multilayer structure comprises the phase shift film, the etching stopper film, and the light shielding film and has an optical density for ArF excimer laser light of at least 2.7.

11. The mask blank according to claim 8, further comprising a hard mask film on the light shielding film, the hard mask film comprising chromium.

12. The mask blank according to claim 8, wherein the etching stopper film essentially consists of silicon and oxygen.

13. The mask blank according to claim 8, wherein a content of oxygen in the lower layer is 5 atom % or less.

14. The mask blank according to claim 8, wherein a content of oxygen in the upper layer is 10 atom % or more.

15. A mask blank comprising:
a transparent substrate;
a phase shift film on the transparent substrate;
an etching stopper film on the phase shift film; and
a light shielding film on the etching stopper film,
wherein the etching stopper film contains silicon and oxygen, and
wherein the light shielding film has a lower layer and an upper layer formed on the lower layer, and
wherein the lower layer contains a transition metal, silicon, and nitrogen and satisfies the following expression (1):

$$C_N \leq (9.0 \times 10^{-6} \times R_M^4) - (1.65 \times 10^{-4} \times R_M^3) - (7.718 \times 10^{-2} \times R_M^2) + (3.611 \times R_M) - 21.084 \quad \text{Expression (1)}$$

where $R_M$ represents a ratio [%] of a content [atom %] of the transition metal to a total content [atom %] of the transition metal and silicon in the at least one layer and where $C_N$ [atom %] represents a content [atom %] of nitrogen in the at least one layer, and
wherein the upper layer contains a transition metal, silicon, oxygen and nitrogen, and
wherein a total content of nitrogen and oxygen in the upper layer is 30 atom % or more, and
wherein a content of transition metal in the upper layer is less than 10 atom %, and
wherein the phase shift film has a surface layer and a layer other than the surface layer having a different composition than the surface layer, and
wherein the layer other than the surface layer contains a transition metal, silicon, nitrogen, and oxygen; has a content of oxygen of 3 atom % or more; and satisfies the following expression (C):

$$(0.04 \times A_S) - (0.06 \times A_M) - (0.03 \times A_N) + (0.02 \times A_O) > 0 \quad \text{Expression (C)}$$

where $A_M$ represents a content [atom %] of the transition metal in the layer other than the surface layer, $A_S$ represents a content [atom %] of silicon in the layer other than the surface layer, $A_N$ represents a content [atom %] of nitrogen in the layer other than the surface layer, and $A_O$ represents a content [atom %] of oxygen in the layer other than the surface layer.

16. The mask blank according to claim 15, wherein a content of oxygen in the surface layer of the phase shift film is larger than a content of oxygen in the layer other than the surface layer.

17. The mask blank according to claim 15, wherein a multilayer structure comprises the phase shift film, the etching stopper film, and the light shielding film and has an optical density for ArF excimer laser light of at least 2.7.

18. The mask blank according to claim 15, further comprising a hard mask film on the light shielding film, the hard mask film comprising chromium.

19. The mask blank according to claim 15, wherein the etching stopper film essentially consists of silicon and oxygen.

20. The mask blank according to claim 15, wherein a content of oxygen in the lower layer is 5 atom % or less.

21. The mask blank according to claim 15, wherein a content of oxygen in the upper layer is 10 atom % or more.

22. A phase shift mask comprising:
a transparent substrate;
a phase shift film pattern on the transparent substrate;
an etching stopper film pattern on the phase shift film pattern; and
a light shielding film pattern on the etching stopper film pattern,
wherein the etching stopper film contains silicon and oxygen, and
wherein the light shielding film has a lower layer and an upper layer formed on the lower layer, and
wherein the lower layer contains a transition metal, silicon, and nitrogen and satisfies the following expression (1):

$$C_N \leq (9.0 \times 10^{-6} \times R_M^4) - (1.65 \times 10^{-4} \times R_M^3) - (7.718 \times 10^{-2} \times R_M^2) + (3.611 \times R_M) - 21.084 \quad \text{Expression (1)}$$

where $R_M$ represents a ratio [%] of a content [atom %] of the transition metal to a total content [atom %] of the transition metal and silicon in the at least one layer and where $C_N$ [atom %] represents a content [atom %] of nitrogen in the at least one layer, and
wherein the upper layer contains a transition metal, silicon, oxygen and nitrogen, and
wherein a total content of nitrogen and oxygen in the upper layer is 30 atom % or more, and
wherein a content of transition metal in the upper layer is less than 10 atom %, and
wherein the phase shift film pattern has a surface layer and a layer other than the surface layer having a different composition than the surface layer, and
wherein the layer other than the surface layer contains a transition metal, silicon, nitrogen, and oxygen; has a content of oxygen of 3 atom % or more; and satisfies the following expression (A):

$$(0.04 \times A_S) - (0.06 \times A_M) > 1 \quad \text{Expression (A)}$$

where $A_M$ represents a content [atom %] of the transition metal in the layer other than the surface layer, and where $A_S$ represents a content [atom %] of silicon in the layer other than the surface layer.

23. The phase shift mask according to claim 22, wherein a content of oxygen in the surface layer of the phase shift film pattern is larger than a content of oxygen in the layer other than the surface layer.

24. The phase shift mask according to claim 22, wherein a multilayer structure comprises the phase shift film pattern, the etching stopper film pattern, and the light shielding film pattern and has an optical density for ArF excimer laser light of at least 2.7.

25. A method of manufacturing a semiconductor device, comprising transferring a transfer pattern on a resist film formed on a transfer substrate by placing the phase shift mask of claim 22 in an exposure apparatus comprising an exposure light source configured to emit ArF excimer laser light.

26. The phase shift mask according to claim 22, wherein the etching stopper film pattern essentially consists of silicon and oxygen.

27. The phase shift mask according to claim 22, wherein a content of oxygen in the lower layer is 5 atom % or less.

28. The phase shift mask according to claim 22, wherein a content of oxygen in the upper layer is 10 atom % or more.

29. A phase shift mask comprising:
a transparent substrate;
a phase shift film pattern on the transparent substrate;
an etching stopper film pattern on the phase shift film pattern; and
a light shielding film pattern on the etching stopper film pattern,
wherein the etching stopper film contains silicon and oxygen, and
wherein the light shielding film has a lower layer and an upper layer formed on the lower layer, and
wherein the lower layer contains a transition metal, silicon, and nitrogen and satisfies the following expression (1):

$$C_N \leq (9.0 \times 10^{-6} \times R_M^4) - (1.65 \times 10^{-4} \times R_M^3) - (7.718 \times 10^{-2} \times R_M^2) + (3.611 \times R_M) - 21.084 \quad \text{Expression (1)}$$

where $R_M$ represents a ratio [%] of a content [atom %] of the transition metal to a total content [atom %] of the transition metal and silicon in the at least one layer and where $C_N$ [atom %] represents a content [atom %] of nitrogen in the at least one layer, and
wherein the upper layer contains a transition metal, silicon, oxygen and nitrogen, and
wherein a total content of nitrogen and oxygen in the upper layer is 30 atom % or more, and
wherein a content of transition metal in the upper layer is less than 10 atom %, and
wherein the phase shift film pattern has a surface layer and a layer other than the surface layer having a different composition than the surface layer, and
wherein the layer other than the surface layer contains a transition metal, silicon, nitrogen, and oxygen; has a content of oxygen of 3 atom % or more; and satisfies the following expression (B):

$$(0.04 \times A_S) - (0.06 \times A_M) - (0.03 \times A_N) > 1 \quad \text{Expression (B)}$$

where $A_M$ represents a content [atom %] of the transition metal in the layer other than the surface layer, $A_S$ represents a content [atom %] of silicon in the layer other than the surface layer, and $A_N$ represents a content [atom %] of nitrogen in the layer other than the surface layer.

30. The phase shift mask according to claim 29, wherein a content of oxygen in the surface layer of the phase shift film pattern is larger than a content of oxygen in the layer other than the surface layer.

31. The phase shift mask according to claim 29, wherein a multilayer structure comprises the phase shift film pattern, the etching stopper film pattern, and the light shielding film pattern and has an optical density for ArF excimer laser light of at least 2.7.

32. A method of manufacturing a semiconductor device, comprising transferring a transfer pattern on a resist film formed on a transfer substrate by placing the phase shift mask of claim 29 in an exposure apparatus comprising an exposure light source configured to emit ArF excimer laser light.

33. The phase shift mask according to claim 29, wherein the etching stopper film pattern essentially consists of silicon and oxygen.

34. The phase shift mask according to claim 29, wherein a content of oxygen in the lower layer is 5 atom % or less.

35. The phase shift mask according to claim 29, wherein a content of oxygen in the upper layer is 10 atom % or more.

36. A phase shift mask comprising:
a transparent substrate;
a phase shift film pattern on the transparent substrate;
an etching stopper film pattern on the phase shift film pattern; and a light shielding film pattern on the etching stopper film pattern, wherein the etching stopper film contains silicon and oxygen, and wherein the light shielding film has a lower layer and an upper layer formed on the lower layer, and wherein the lower layer contains a transition metal, silicon, and nitrogen and satisfies the following expression (1):

$$C_N \leq (9.0 \times 10^{-6} \times R_M^4) - (1.65 \times 10^{-4} \times R_M^3) - (7.718 \times 10^{-2} \times R_M^2) + (3.611 \times R_M) - 21.084 \quad \text{Expression (1)}$$

where $R_M$ represents a ratio [%] of a content [atom %] of the transition metal to a total content [atom %] of the transition metal and silicon in the at least one layer and where $C_N$ [atom %] represents a content [atom %] of nitrogen in the at least one layer, wherein the upper layer contains a transition metal, silicon, oxygen and nitrogen, and wherein a total content of nitrogen and oxygen in the upper layer is 30 atom % or more, and wherein a content of transition metal in the upper layer is less than 10 atom %, and wherein the phase shift film pattern has a surface layer and a layer other than the surface layer having a different composition than the surface layer, and wherein the layer other than the surface layer contains a transition metal, silicon, nitrogen, and oxygen; has a content of oxygen of 3 atom % or more; and satisfies the following expression (A):

$$(0.04 \times A_S) - (0.06 \times A_M) - (0.03 \times A_N) + (0.02 \times A_O) > 0 \quad \text{Expression (C)}$$

where $A_M$ represents a content [atom %] of the transition metal in the layer other than the surface layer, $A_S$ represents a content [atom %] of silicon in the layer other than the surface layer, $A_N$ represents a content [atom %] of nitrogen in the layer other than the surface layer, and $A_O$ represents a content [atom %] of oxygen in the layer other than the surface layer.

37. The phase shift mask according to claim 36, wherein a content of oxygen in the surface layer of the phase shift film pattern is larger than a content of oxygen in the layer other than the surface layer.

38. The phase shift mask according to claim 36, wherein a multilayer structure comprises the phase shift film pattern, the etching stopper film pattern, and the light shielding film pattern and has an optical density for ArF excimer laser light of at least 2.7.

39. A method of manufacturing a semiconductor device, comprising transferring a transfer pattern on a resist film formed on a transfer substrate by placing the phase shift mask of claim 36 in an exposure apparatus comprising an exposure light source configured to emit ArF excimer laser light.

40. The phase shift mask according to claim 36, wherein the etching stopper film pattern essentially consists of silicon and oxygen.

41. The phase shift mask according to claim 36, wherein a content of oxygen in the lower layer is 5 atom % or less.

42. The phase shift mask according to claim 36, wherein a content of oxygen in the upper layer is 10 atom % or more.

* * * * *